(12) United States Patent
Gilman

(10) Patent No.: US 8,114,702 B2
(45) Date of Patent: Feb. 14, 2012

(54) METHOD OF MANUFACTURING A MONOLITHIC THIN-FILM PHOTOVOLTAIC DEVICE WITH ENHANCED OUTPUT VOLTAGE

(75) Inventor: Boris Gilman, Mountain View, CA (US)

(73) Assignee: Boris Gilman, Mountain View, CA (US)

( * ) Notice: Subject to any disclaimer, the term of this patent is extended or adjusted under 35 U.S.C. 154(b) by 129 days.

(21) Appl. No.: 12/802,391

(22) Filed: Jun. 7, 2010

(65) Prior Publication Data

US 2011/0300663 A1   Dec. 8, 2011

(51) Int. Cl.
*H01L 21/00*    (2006.01)

(52) U.S. Cl. .......................................................... 438/80

(58) Field of Classification Search .......................... None
See application file for complete search history.

(56) References Cited

U.S. PATENT DOCUMENTS

| | | |
|---|---|---|
| 6,281,428 B1 | 8/2001 | Chiu et al. |
| 2007/0240759 A1 | 10/2007 | Borden |
| 2009/0301543 A1 | 12/2009 | Reddy et al. |
| 2010/0018564 A1 | 1/2010 | Shinohara |
| 2010/0065099 A1 | 3/2010 | Tandon et al. |
| 2010/0078064 A1 | 4/2010 | Coakley |

FOREIGN PATENT DOCUMENTS

WO   WO 2009/117083   9/2009

OTHER PUBLICATIONS

Physics of Semiconductor Devices, Second Edition, by S.M. Sze, John Wiley and Sons, 1981, pp. 825-830.
"Amorphous Silicon-Based Photovoltaics—from Earth to the "final Frontier" by Jeffrey Yang, et al., in: Solar Energy Materials & Solar Cells", v.78, pp. 597-612.
"Etching Properties of Hydrogenated Amorphous Silicon", Y.S. Tsuo et al., Solar Energy Research Institute, Mat.Res.Soc.Symp.Proc., vol. 219, 1991 pp. 805-810.

*Primary Examiner* — Scott B Geyer

(57) ABSTRACT

The invention provides a method of manufacturing a monolithic thin-film photovoltaic cell or module with enhanced output voltage as high as 100 V or higher in a single microelectronic process without connecting in series a plurality of premanufactured solar cells. The method consists of forming a plurality of adjacent individual TSCs arranged on a common transparent substrate in the longitudinal direction of the substrate. Each TSC consists of a pair of PV cells having PIN and NIP structures, respectively, with substantially coplanar position of a P-doped layer of one of the cells with respect to an N-doped layer of another cell of the pair. A tunnel junction is formed between the cells of the pair by overlapping P-doped and N-doped layers in the area near the common transparent substrate. The alternating PIN and NIP structures are achieved by forming projections in a continuous monolithic structure of one type and filling the spaces between the projections with the material of the inverse structure of the other type.

20 Claims, 14 Drawing Sheets

METHOD OF MANUFACTURING A MONOLITHIC THIN-FILM PHOTOVOLTAIC DEVICE WITH ENHANCED OUTPUT VOLTAGE

FIELD OF THE INVENTION

The present invention relates to solar energy conversion devices, in particular, to a method of manufacturing thin-film photovoltaic cells and modules. More specifically, the invention relates to a method of manufacturing an integrated monolithic thin-film solar cell with enhanced output voltage and automatic current matching between component cells. The enhanced output voltage of the device of the invention can be as high as 100 V or higher and can be achieved by manufacturing a single monolithic device in a single microelectronic process without connecting in series a plurality of premanufactured solar cells.

BACKGROUND OF THE INVENTION

At the present time thin-film solar cells (TFSCs) and panels represent one of the largest segments of the photovoltaic industry, mainly due to their low cost, possibility of using large and flexible substrates, and improved thermal properties. The most popular materials for TFSCs include hydrogenated amorphous silicon ($\alpha$Si:H), microcrystalline or nanocrystalline Si, CdTe/CdS, and CuInGaSe (CIGS). A general description of these TFSCs is given in *Physics of Semiconductor Devices*, Second Edition, by S. M. Sze, John Wiley and Sons, 1981, pp. 825 to 830.

An $\alpha$Si:H-based TFSC is typically made in the form of a single $\alpha$Si:H-layer that contains a PIN structure or in the form of stacked $\alpha$Si:H-layers wherein each layer consists of a PIN structure and wherein a connection between layers is made through a tunnel junction (TJ). The latter design is commonly known as a tandem solar cell (TSC) or a multijunction solar cell (MJSC). Underneath the $\alpha$Si:H top layer, a TSC may also include layers of microcrystalline or nanocrystalline Si. A tandem design is generally preferred because it exhibits higher output voltage ($V_{out}$) and higher power conversion efficiency (PCE) compared to a single-layer cell. When a TSC is made exclusively of $\alpha$Si:H layers, the tandem design is used to reduce impact from the Staebler-Wronsky (SW) effect. A detailed description of an $\alpha$Si:H-based TSC is given in "Amorphous silicon-based photovoltaics—from earth to the "final frontier" by Jeffrey Yang, et al., in *Solar Energy Materials & Solar Cells*", v. 78, pp. 597 to 612. It should be noted that all known TSCs are designed as "vertical" structures, wherein the top PV cell is formed on the surface of the bottom PV cell, i.e., on the light-receiving side of a TSC and absorbs solar radiation of high photon energy (i.e., with shorter wavelengths), while the bottom PV cell (or cells) is formed beneath the top PV cell and absorbs radiation of the low photon energy (longer wavelength).

The general fabrication process for a conventional stacked thin-film tandem solar cell (hereinafter referred to as a "TFSC") is described, e.g., in U.S. Patent Application Publication No. 20070240759 published in 2007 (inventor, P. Borden). According to one aspect, the module includes separate terminals for the respective layers in the stack, thus allowing the current in each layer to vary without sacrificing efficiencies gained because of varying bandgaps. According to another aspect, a processing method according to the invention includes forming interconnects for each layer using etch and deposition processing, including forming separate interconnects for each respective layer, the interconnects of which can be coupled to respective sets of terminals.

U.S. Patent Application Publication No. 20100065099 published in 2010 (inventor, S. Neumann, et al) discloses a method of manufacturing a monolithically interconnecting electrical devices that isolates and interconnects the contacts of neighboring electrical devices, such as thin film PV cells, without damaging surrounding materials. The method comprises the following steps: providing a first conducting layer covering at least one semiconductor layer covering a second conducting layer covering a substrate; forming a first trench penetrating through at least the first conducting layer; forming a second trench such that the second trench penetrates through at least one semiconductor layer and the second conducting layer; forming a third trench such that the third trench penetrates through at least one semiconductor layer; at least partially filling the second trench with a resistive material; at least partially filling the third trench with an electrically conductive material such that it provides an electrical current pathway from the first electrical device first conducting layer to the second electrical device second conducting layer, wherein at least the second or third trench is within the boundaries of the first trench.

U.S. Patent Application Publication No. 20100065099 published in 2010 (inventor: S. Neumann, et al.) discloses a method of manufacturing a monolithically interconnecting electrical devices that isolates and interconnects the contacts of neighboring electrical devices such as thin film PV cells, without damaging the surrounding materials. The method comprises the following steps: providing a first conducting layer covering at least one semiconductor layer covering a second conducting layer covering a substrate; forming a first trench penetrating through at least the first conducting layer; forming a second trench such that the second trench penetrates through at least one semiconductor layer and the second conducting layer; forming a third trench such that the third trench penetrates through at least one semiconductor layer; at least partially filling the second trench with a resistive material; at least partially filling the third trench with an electrically conductive material such that it provides an electrical current pathway from the first electrical device first conducting layer to the second electrical device second conducting layer, wherein at least the second or third trench is within the boundaries of the first trench.

U.S. Patent Application Publication No. 200900301543 published in 2009 (inventor, D. Reddy, et al) discloses a process for making a thin-film photovoltaic device by providing a substrate with a plurality of holes, depositing a metal electrode layer on each side of the substrate for creating bottom and back electrodes, scribing a portion of the metal layer from the circumference of the holes to electrically isolate the holes from the bottom electrode, and scribing the bottom and back electrodes longitudinally for forming adjacent cells. As a result, the adjacent cells acquire electrical contact with one another through at least one contact between the bottom electrode of one cell and the back electrode of an adjacent cell through at least one hole that is positioned between the bottom scribe and the back electrode scribe. The process is accomplished by depositing an absorber layer and a transparent conductor layer. As a result, a thin-film photovoltaic device with monolithic integration and backside metal contacts is obtained.

SUMMARY OF THE INVENTION

The present invention provides a novel and efficient method of manufacturing an integrated monolithic thin-film solar cell (hereinafter referred to as "MTF-SC") comprising a plurality of individual TSCs arranged on a transparent common substrate in the longitudinal direction on the light-receiving side, The invention allows generating significantly enhanced output voltage $V_{out}$ whereby an MTF-SC can be used as a photovoltaic generator.

The method of the invention comprises the following steps. First a common transparent substrate is provided. This substrate can be made from a glass plate or a flexible plastic material, such as polyamide, or the like, and a precoated antireflection (AR) index-matching film, such as silicon dioxide or silicon nitride. The substrate can be pretextured so as to reduce light reflection and to improve light-trapping efficiency. On the backside, which is opposite the common transparent substrate, the device has a planar surface on which all contacts (electrodes) of the PV cells of individual TSCs and interconnection between the adjacent TSCs are formed. Among other features, the described design eliminates shadowing from, e.g., metal contacts and lines, on the front surface of the MTF-SC, thereby allowing use of the maximum amount of incoming radiation.

Each TSC of the present device is formed from two PV cells (referred to as "first PV cell" and "second PV cell"), each having an adjacent PIN structure formed on the common transparent substrate and connected in series through the tunnel junction. The tunnel junction is formed between a portion of the N-doped layer (hereinafter referred to as "N-layer") of the first PV cell, which extends into the second PV cell, and the P-doped layer (hereinafter referred to as "P-layer") of the second PV cell. An insulating layer isolates the first PV cell from the second PV cell.

The method of the invention is characterized by the fact that the PIN structures of the aforementioned first and second PV cells are formed on the common transparent substrate with inversed sequences of doped layers so that the PIN structure of the first PV cell of an individual TSC is arranged adjacent and coplanar to the NIP structure of the second PV cell, and vice versa. Here, the layer sequence is defined in the direction from the backside toward the light-receiving surface and can be inversed for both first and second PV cells so that if the first PV cell has a NIP structure, the second PV cell has a PIN structure, and if the first PV cell has a PIN structure, the second PV cell has a NIP structure. In any case, the P-layer of one of these PV cells is coplanar to the N-layer of the other of these PV cells.

According to one or more aspects of the present invention, individual TSCs of the MTF-SC are reliably separated and isolated from each other by narrow deep trenches formed vertically between all adjacent TSCs. The deep trenches are etched off through the entire TSC structures down to the transparent common substrate. According to one aspect of the present invention, the aforementioned deep trenches can be filled with an insulating material, such as silicon oxide, silicon nitride, or the like, which provides a reliable electrical isolation of adjacent TSCs as well as an insulating layer on the backside surface that is suitable for further interconnection of individual TSCs. The deep trenches and the insulating layer described above are made according to well-known patterning processes such as photolithography, reactive ion etching (RIE) or laser scribing, and chemical vapor deposition (CVD).

According to one aspect of the method of the present invention, metal electrodes of the TSCs are formed on the P-layers of the first PV cells and on the N-layers of the second PV cells. Furthermore, in order to generate enhanced $V_{out}$, metal links are formed on the backside surface of the device over the insulating layers for connecting adjacent individual TSCs in series. The aforementioned metal link of each individual TSC connects the electrode formed on the N-layer of the second PV cell of this TSC to the electrode formed on the P-layer of the first PV cell of the adjacent TSC.

According to the method of the present invention, the first and second PV cells are chosen to make thicknesses of the photoactive intrinsic layers (hereinafter referred to as "I-layers") and cross-sectional areas of first and second PV cells equal or substantially equal to each other, thus providing equal or nearly equal photocurrents to be generated in the PV cells of each TSC. This ensures perfect current-matching conditions in all individual TSCs. Furthermore, to reduce radiation and photocurrent losses in the trench regions, the deep trenches are formed to be as narrow as possible when compared with the areas of the PV cells.

All aforementioned photo-active layers, isolations, trenches, PV-cell electrodes, and connecting metal links are formed on the backside surface by means of well known masking processes and other processes common to microelectronics.

BRIEF DESCRIPTION OF THE DRAWINGS

FIG. 2 shows a common transparent substrate used in the device in FIG. 1;

FIG. 3 shows the common transparent substrate in FIG. 2 onto which a continuous PIN structure is deposited for forming first PV cells;

FIG. 4 shows the structure in FIG. 3, in which alternating recesses are formed for subsequent deposition of an NIP structure for forming second PV cells;

FIG. 5 is a view that illustrates deposition of the first insulating layer onto the entire surface of the structure in FIG. 4;

FIG. 6 is a view of the structure obtained after removal of the first insulating layer from the bottom of each recess shown in FIG. 5;

FIG. 7 is a view of the structure obtained after deposition of the NIP structure over the surface of the structure in FIG. 6 for subsequently forming second PV cells;

FIG. 8 shows the structure obtained after removal of those portions of the NIP structure in FIG. 7 that are not coplanar with the PIN structures in FIG. 4;

FIG. 9 is a view of the structure obtained after removal of the first insulating layer from the surface of the structure in FIG. 8;

FIG. 10 is a view of the structure in FIG. 9 that is coated over the entire surface with a second insulating layer;

FIG. 11 is a view of the structure in FIG. 10 with deep trenches formed from the surface of the second insulating layer to the common transparent substrate, the trenches defining and isolating adjacent individual TSCs;

FIG. 12 is a view of the structure obtained after filling the trenches with an insulating material;

FIG. 13 is a view of the structure obtained after forming the first windows for metal electrodes of the first and second PV cells in all individual TSCs;

FIG. 14 shows the structure obtained after depositing the first metal layer over the entire surface of the structure in FIG. 13;

FIG. 15 is a view of the structure obtained after forming metal electrodes of the first and second PV cells in all individual TSCs;

FIG. 16 is a top view of the structure shown in FIG. 15;

FIG. 17 is a view of the structure obtained after coating the entire surface of the structure shown in FIG. 15 with a third insulating layer;

FIG. 18 is a view of the structure obtained after forming second windows in the third insulating layer for conducting links to connect the second PV cell of each TSC with the first PV cell of the adjacent TSC;

FIG. 19 is a view of the structure obtained after depositing the second metal layer over the entire surface of the structure in FIG. 18; and FIG. 20 is a longitudinal sectional view of a final MTF-SC, which is similar to the device in FIG. 1 and is obtained by the method of the invention after forming conductive links and depositing a protective layer.

DETAILED DESCRIPTION OF THE INVENTION

Figure 1:
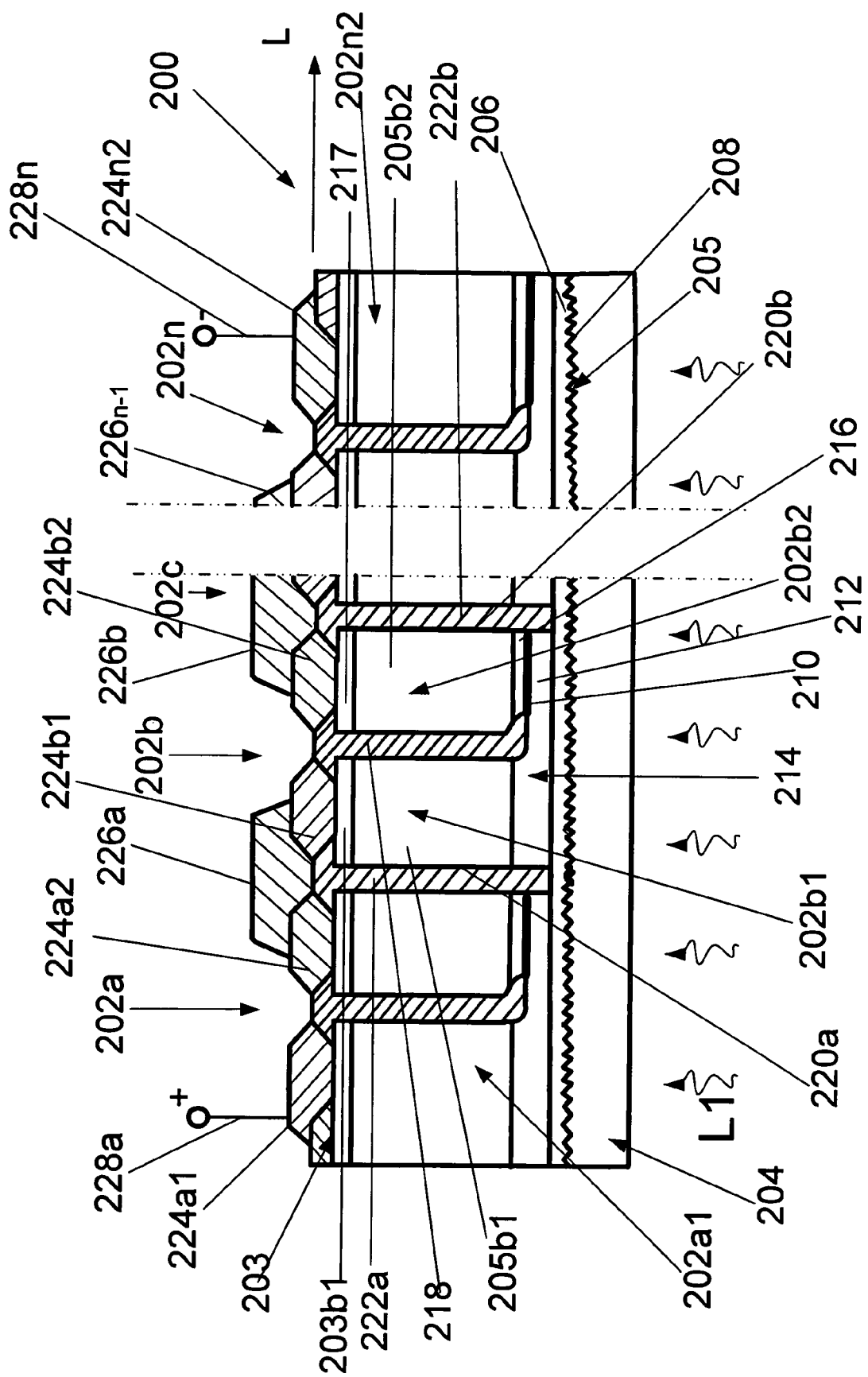
FIG. 1 is a schematic cross-sectional view of an MTF-SC comprising a plurality of individual TSCs connected in series for manufacture of which the method of the invention is intended.

The method of the invention is aimed mainly at manufacturing a monolithic thin-film solar cell (MTF-SC) 200 of the type shown in FIG. 1, which is a longitudinal and sectional view of the device. The MTF-SC 200 the subject of our earlier and pending U.S. patent application Ser. No. 12/799,672 of Apr. 29, 2010. For better understanding of the method of the invention, it is advantageous first to familiarize the reader with the structure of the MTF-SC 200, which is incorporated herein by reference.

In the context of the present patent application, the term "monolithic thin-film solar cell" or "MTF-SC" means a photovoltaic device that consists of a plurality of electrically connected photovoltaic cells manufactured in a single manufacturing process. In other words, the monolithic device of the invention produces an output voltage $V_{out}$ of approximately 100 V or higher, which can be referred to as "gigantic" as compared to similar devices in prior art. This gigantic output voltage is achieved by means of a single monolithic thin-film photovoltaic device of the invention manufactured on a common transparent substrate in a single process with a plurality of thin-film functional layers that are interconnected in a unique and specific way.

More specifically, the MTF-SC 200 comprises a plurality of individual tandem solar cells (hereinafter referred to as "individual TSCs") 202a through 202n, where TSCs 202a and 202n are terminal TSCs. The terminal TSCs are generally the same as the intermediate TSCs of the type designated by reference numeral TSC 202b, but they have some specific minor differences, as described below.

Individual TSCs 202a through 202n are arranged side by side in the longitudinal direction of a common transparent substrate 204 on which the individual TSCs 202a through 202n are formed. The longitudinal direction of the common transparent substrate 204 coincides with the directional arrow L in FIG. 1. The invention allows for generation of significantly enhanced output voltage $V_{out}$, whereby the MTF-SC can be used as the photovoltaic generator.

In FIG. 1, reference numeral 205 designates a light-receiving surface of the MTF-SC 200 that receives solar radiation, shown by curved arrows L1, through a transparent substrate 204. The common transparent substrate 204 can be precoated with an antireflection (AR) index-matching film 206 made, e.g., from silicon dioxide, silicon nitride, or both.

As shown in FIG. 1 by reference numeral 208, the surface of the common transparent substrate 204 can be pretextured, as commonly done for known PV devices, to reduce light reflection and to improve light-trapping efficiency of the device. The side 203, which is opposite the transparent common substrate 204 and hereinafter referred to as the "backside" of the MTF-SC 200, contains all electrical connections, as described below. Such an arrangement prevents shadowing the light-receiving surface 205 of the MTF-SC 200 with elements such as metal contacts, lines, etc. Thus, the maximum amount of incident light L1 can be used.

Since all individual TSCs 202a through 202n are identical, except for minor layout distinctions of the terminal TSCs, the following detailed description of the individual TSCs relates only to an intermediate TSC 202b. It is understood that a plurality (n−2, where "n" is the total number of TSCs) of such intermediate TSCs 202b constitutes the main part of the MTF-SC 200 and determines the output characteristics of the device as a whole.

The individual TSC 202b consists of a pair of thin-film photovoltaic cells (hereinafter referred to as "PV cells") arranged side by side on the common transparent substrate 204 in the longitudinal direction of the substrate. These PV cells, which comprise a first thin-film photovoltaic cell 202b1 and a second photovoltaic cell 202b2, are referred to as "a first PV cell 202b1" and a "second PV cell 202b2", respectively. Each PV cell has a PIN structure, which is laterally formed on the common transparent substrate 204 next to the adjacent PV cell, and is connected to the adjacent PV cell of the same TSC in series through the tunnel junction 210 that is formed between a portion 212 of the N-layer of the first PV cell 202b1, which extends into the second PV cell 202b2, and a P-layer 216 of the second PV cell 202b2.

Each PV cell included in each individual TSC consists of a P-layer, an I-layer, and an N-layer. More specifically, as shown in FIG. 1, the first PV cell 202b1 contains a P-layer 203b1, an I-layer 205b1, and the aforementioned N-layer 214. On the other hand, the second PV cell 202b2 contains the aforementioned P-layer 216, an I-layer 205b2, and an N-layer 217.

It can be seen in FIG. 1 that according to the invention, the P-layer 203b1 of the first PV cell 202b1 (which is one of the thin-film photovoltaic cells of the pair) is arranged substantially coplanar to the N-layer 217 of the second PV cell 202b2 of the pair and that one of the doped layers of the first thin-film photovoltaic cell (which in FIG. 1 is the N-layer 214) has a portion 212 that extends under the P-layer 216 of the second PV cell 202b2, thus forming overlapped layers. Consequently, when one of the overlapped layers is a P-layer, the other is an N-layer. The overlapped layers form an area of the tunnel junction 210 through which the first PV cell and the second PV cell are electrically connected in series.

The aforementioned first PV cell 202b1 and the second PV cell 202b2 of the individual TSC 202b are isolated by means of a first insulating layer 218 that is formed over the entire interface between the cells, except for the portion 212. Furthermore, the first insulating layer 218 has shoulders that overlap a part of the back side 203, which makes it possible to isolate the first and second PV cells from each other except for the area of the tunnel junction 210.

Individual TSCs 202a through 202n of the MTF-SC 200 are reliably separated and isolated from each other by narrow and deep through trenches, such as through trenches 220a and 220b. Although the number of such trenches will be (n−1), where "n" is the number of the individual TSC in the entire device, only two trenches are shown in FIG. 1. The through trenches are formed vertically between the surface of the AR film 206 and the backside 203 of the MTF-SC 200.

The aforementioned deep trenches can be filled with an electrically insulating material, such as silicon oxide, silicon nitride, or the like, which forms insulating layers 222a and 222b that provide reliable electrical isolation of the adjacent TSCs. The same insulating layers have shoulders that overlap a part of the backside 203 adjacent to the trenches, which enables reliable interconnection between individual TSCs. Deep trenches 220a and 220b and insulating layers 222a and 222b are formed according to well-known patterning processes such as photolithography, etching, and CVD deposition.

The first PV cell and the second PV cell of each individual TSC has a conductive electrode formed on the P-layer of the first PV cell and on the N-layer of the second PV cell. The TSC 202b, which is considered the example of all other similar TSCs, contains a first electrode 224b1 formed on the P-layer 203b1 of the first PV cell 202b1 and a second electrode 224b2 formed on the N-layer 217 of the second PV cell 202b2, and so on. In order to provide conditions for maximal back reflection of incident light from the backside 203, the electrodes, such as electrodes 224b1 and 224b2, should be large enough to cover the largest possible area of the PV cell. Moreover, the combination of electrodes having high reflective properties, such as electrodes 224b1 and 224b2, with the pretextured surface of the common substrate 208 provides good light-trapping conditions. Therefore, I-layers, such as I-layers 205b1 and 205b2 of the PV cells, can be thinly formed to reduce negative impact from the Staebler-Wronsky effect.

Figure 2:
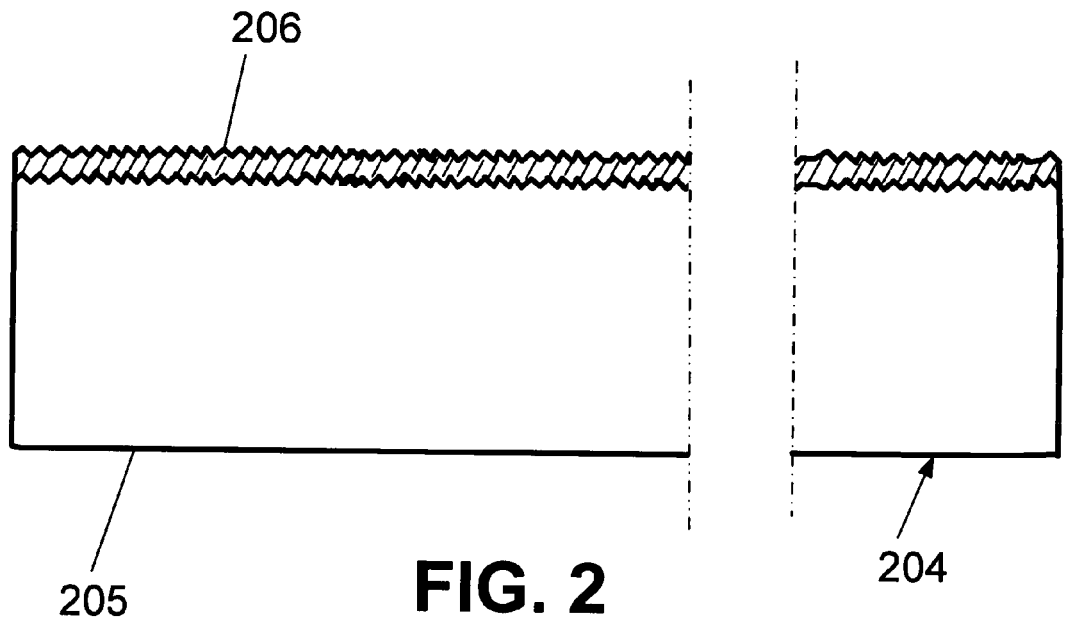
FIGS. 2 to 20 are sectional views of thin-film structures resulting from sequential steps of the method of the invention for manufacturing the device of FIG. 1, as follows.
Figure 3:
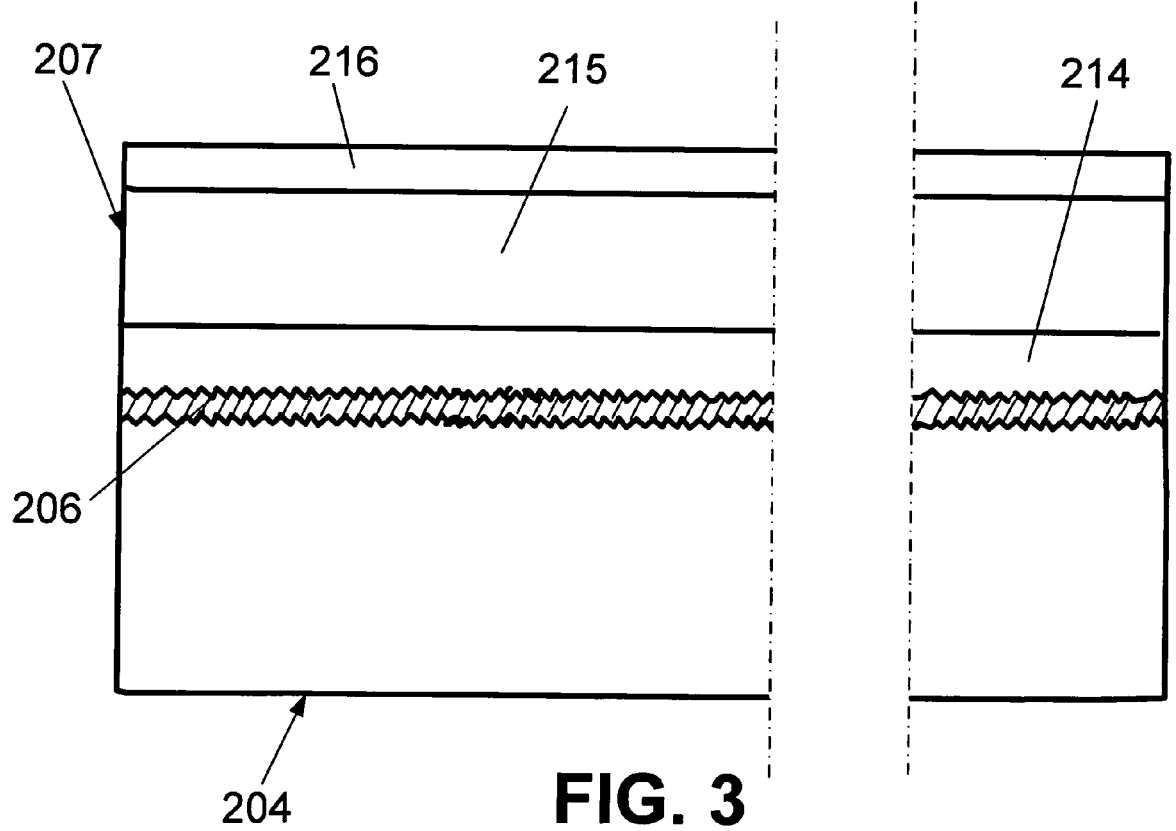

To connect sequentially arranged individual TSCs in series and thus to provide enhanced output voltage $V_{out}$, each individual TSC is connected to its adjacent TSC by means of a conductive link. Thus, TSC 202a is connected to TSC 202b by a conductive link 226a (FIGS. 2 and 3). Other conductive links are designated by reference numerals 226b through $226_{n-1}$. The individual TSC 202b is connected to the next adjacent TSC 202c (only a part of which is shown in FIG. 1), and so on. Thus, each conductive link connects the second PV cell of an individual TSC with the first PV cell of the next adjacent TSC, except for terminal TSCs 202a and 202n, which are used as output terminals of the MTF-SC 200. In particular, the conductive electrode 224a1 is connected to an output lead 228a, while the conductive electrode 224n2 is connected to an output lead 228n. In order to make room for output contacts, the conductive electrode 224a1 of the first PV cell 202a1 of the terminal TSC 202a and the conductive electrode 224n2 of the second PV cell 202n2 of the terminal TSC 202n are made slightly larger than the respective electrodes of the intermediate TSCs.

Each cell of the pair has a lateral dimension in the longitudinal direction L of the common transparent substrate 204 and a thickness in the direction perpendicular to the longitudinal direction L of the common transparent substrate 204.

Dimensions of the first and second PV cells are chosen to form thicknesses of the photoactive intrinsic I-layers and cross-sectional areas of first and second PV cells equal or substantially equal to each other, thus providing equal or nearly equal photo current generated in the cells of each individual TSC. This ensures perfect current-matching conditions in all individual TSCs. Furthermore, to reduce radiation and photo current losses in the trench region, the deep trenches are formed to be as narrow as possible when compared with the areas of the PV cells.

The principle of operation of the MTF-SC 200 shown in FIG. 1 is described in aforementioned U.S. patent application Ser. No. 12/799,672 of Apr. 29, 2010 and therefore is omitted from the present patent application.

The method of the invention for manufacturing the MTF-SC of the type shown in FIG. 1 is now described with reference to FIGS. 2 through 20.

First, a common transparent substrate 204 (shown in FIG. 2) is provided. In FIG. 2, reference numeral 205 designates a light-receiving surface of the substrate that is intended for receiving radiation which is to be converted by the MTF-SC of FIG. 1 into electrical power. The common transparent substrate 204 comprises a glass plate made, e.g., from borosilicate glass, soda lime glass, polyamide film, polyethersulfone, vinyl, etc. The substrate can have any thickness suitable for solar modules, e.g., 1 to 3 mm for glass, or approximately 0.1 mm for substrates made from flexible polymer films. The common transparent substrate 204 can be precoated with an antireflection (AR) index-matching film 206 made, e.g., from silicon dioxide, silicon nitride, or both.

In the next step, a first continuous monolithic PIN structure 207 is deposited onto a common transparent substrate 204, which is shown in FIG. 2, more specifically onto the surface of the AR index-matching film 206 in order to form the first PV cells, such as PV cells 202a1 and 202b1, which are shown in FIG. 1. Shown in FIG. 3 is a longitudinal sectional view of the first monolithic structure that consists of an N-layer 214, an intermediate I-layer 215, and a top P-layer 201. The layers of the first monolithic structure can comprise a PIN structure or NIP structure wherein the sequence of layers is defined in the direction toward the common transparent substance 204. In other words, according to the invention and as explained below, the sequence of layers in the PIN structure can be reversed, i.e., the P-layer can be formed as the bottom layer, and the N-layer can be formed as the top layer of the structure. Let us assume for the illustrated embodiment of the method that the sequence of layers corresponds to that shown in FIG. 3.

As known in the art, P-layers, N-layers, and I-layers can be made of materials such as hydrogenated amorphous silicon (αSi:H), microcrystalline or nanocrystalline hydrogenated silicon (μc-Si:H and nc-Si:H, respectively), copper-indium-selenium (CIS), copper-indium-gallium-selenium (CIGS), etc. If the N-layer is a bottom layer 214, it can have a thickness in the range of 0.1 to 0.15 μm. The I-layer can have a thickness in the range of 0.5 μm to 0.7 μm, and the P-layer (top layer) can have a thickness in the range of 0.01 to 0.05 μm. The indicated ranges are given only as examples and can vary, depending on the process accuracy and electrical requirements of the final product. The layers of the PIN structure shown in FIG. 3 are deposited by methods known in the art, e.g., by RF-PECVD methods described in the Patent Application WO2009117083 (published in 2009, inventors: Appadurai, et al).

Figure 4:
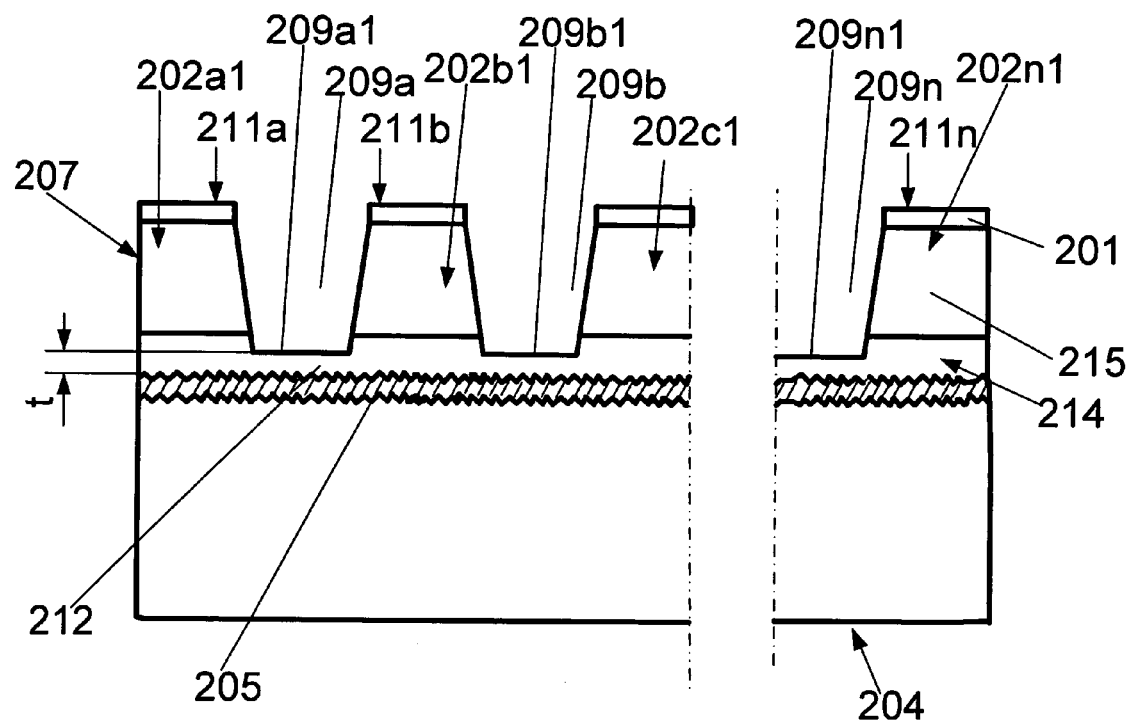

In the next step, which is shown in FIG. 4, alternating recesses 209a through 209n are formed in the first monolithic PIN structure 207 to the depth from the top surface of the P-layer 201 to the N-layer 214. However, the recesses do not penetrate to the substrate, and a certain thickness "t" is left between the surface of the AR-index-matching film 206 and the bottoms 209a1 through 209n1 of each respective recesses 209a through 209n. This results in the extension 212 of the N-layer 214 of the first PV cells 202a1, 202b1, etc., into the area in which the second PV cells 202a2, 202b2, etc., are formed.

These recesses can be formed according to commonly known masking and etching processes. For example, the recesses can be chemically etched (as described in Materials Research Society Symposium Proceedings No. 219, 1991) or can be formed by an RF hydrogen plasma method, A test structure may be required to control the accuracy of the α-Si:H etch.

In masking and etching processes, the lateral dimensions of recesses, i.e., dimensions of recesses in the direction of arrow L shown in FIG. 1, are controlled so that the width of these recesses is substantially equal to the width of the adjacent projections that form the first PV cells of respective TSCs. In other words, dimensions of the first and second PV cells are chosen to form thicknesses of the photoactive intrinsic I-layers and cross-sectional areas of the first and second PV cells equal or substantially equal to each other, thus providing equal or nearly equal photo currents generated in the cells of each TSC. This ensures perfect current-matching conditions in all individual TSCs. Furthermore, to reduce radiation and photocurrent losses in the trench region, the deep trenches are made as narrow as possible when compared to the areas of the PV cells.

The width dimension takes into account the width of the subsequent trench to be cut for the formation of an insulation layer between the adjacent TSCs. In other words, the etching process has to take into consideration lateral overetching for subsequent application of insulating layers on the walls of the recesses and a part of the overlapped region on the bottom of the recess between the N-layer and the I-layer.

Projections 211a through 211n, which remain after formation of recesses 209a through 209n, constitute the first PV cells 202a1, 202b1, etc., as shown in FIG. 1.

Figure 5:
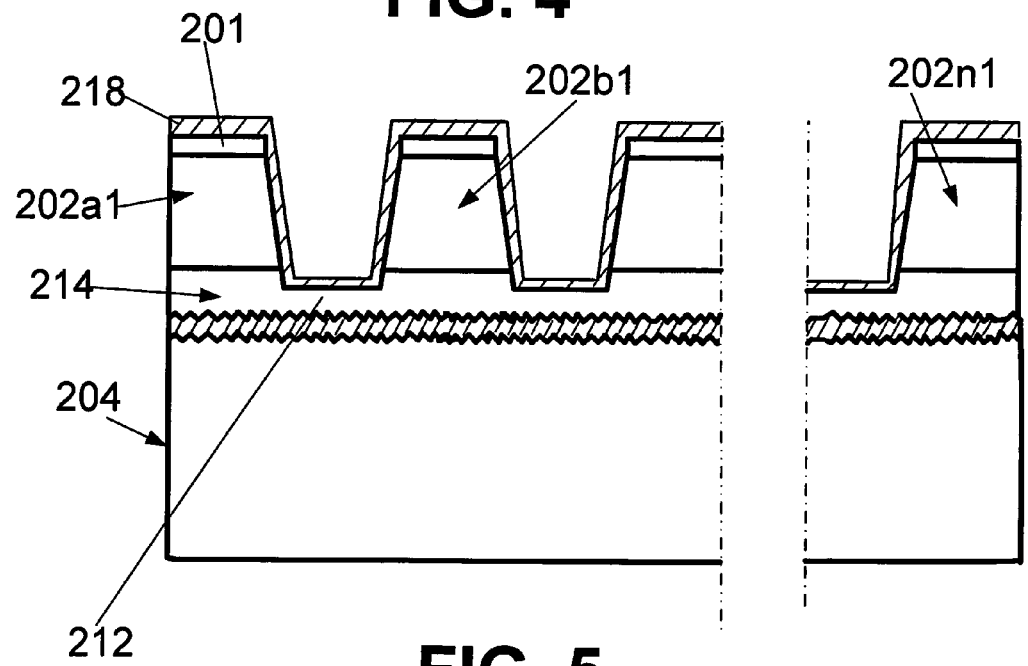
Figure 6:
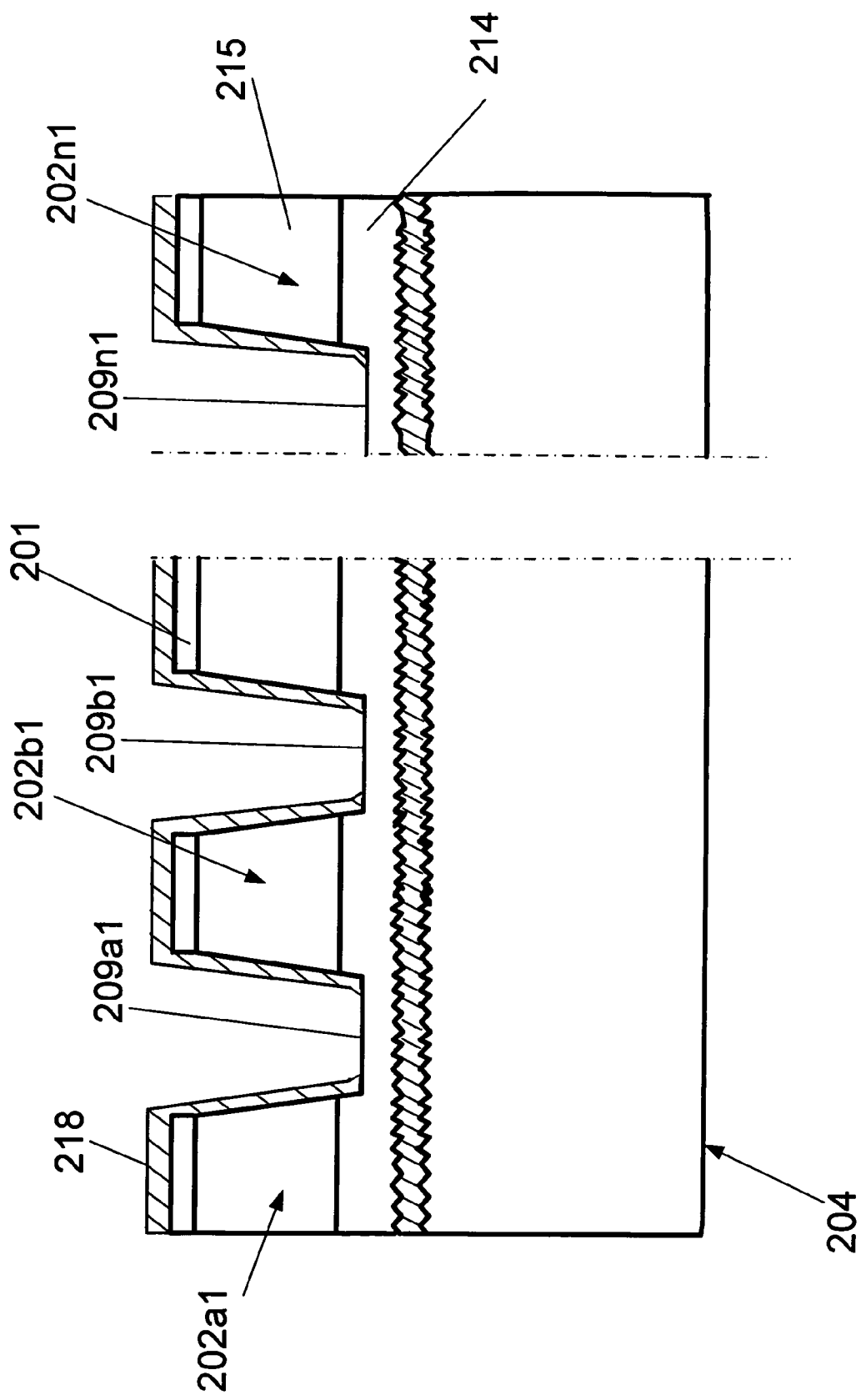

In the next step, which is shown in FIG. 5, the entire surface of the structure in FIG. 4 is subjected to first passivation. In other words, the surfaces of projections 211a through 211n and the bottom surfaces of recesses 209a through 209n are coated with a first insulating layer 218 (FIG. 1), e.g., of $SiO_2$. In order not to impair properties of hydrogenated amorphous silicon (αSi:H), deposition of the first insulating layer 218 should be carried out at a relatively low temperature, e.g., about 300° C. The insulating layer should have a thickness ranging from 0.1 μm to 0.3 μm. As shown in FIG. 6, the first insulating layer 218 is selectively etched to remove the insulating layer only from the bottom surfaces of recesses 209a through 209n, whereby only the bottom surfaces 209a1 through 209n1 are exposed. This can be done, e.g., by selective RIE etching, which is known in art. Alternatively, an additional masking step can be included in the process (not shown).

Figure 7:
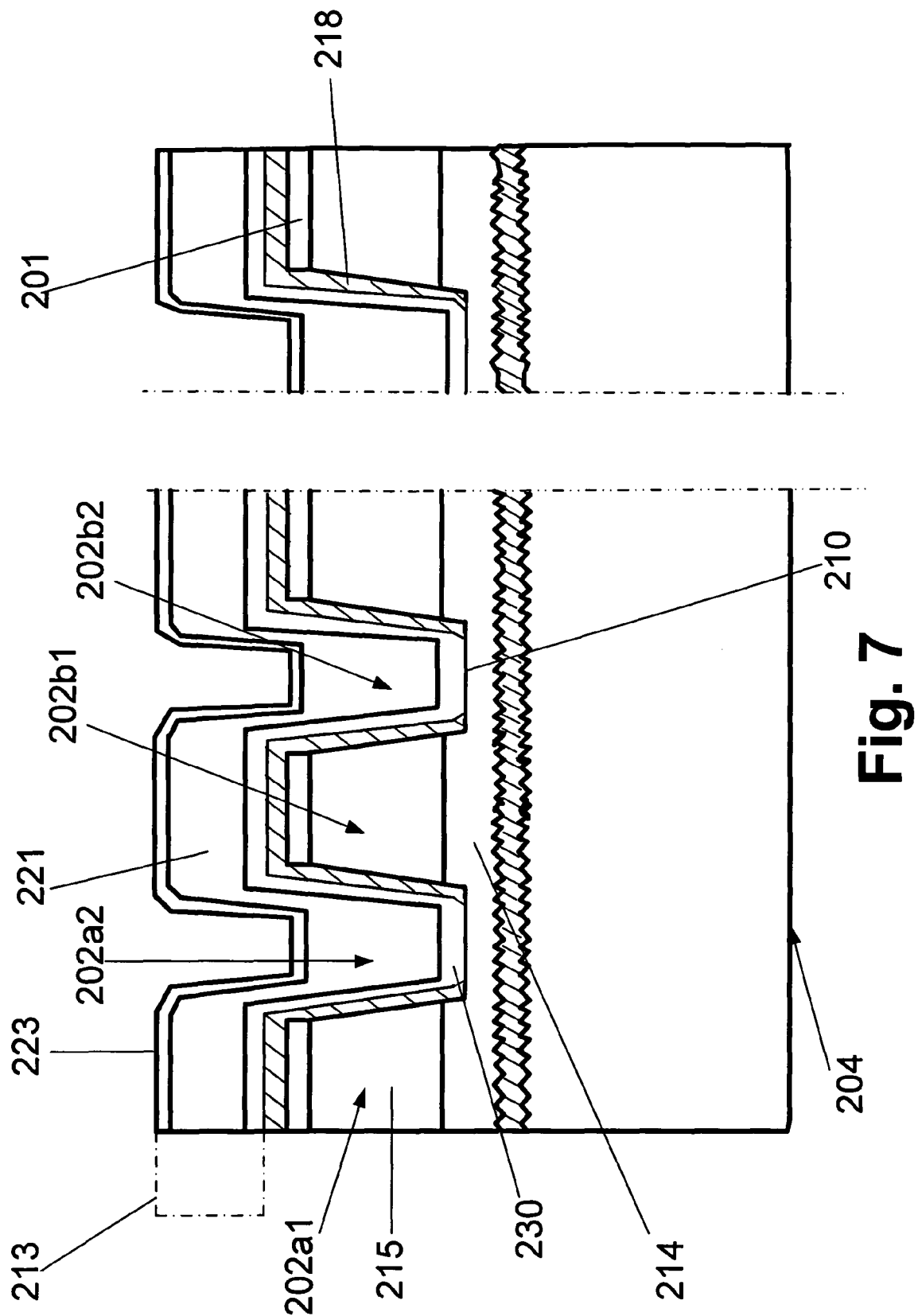

As shown in FIG. 7, a second continuous monolithic structure comprising a P-layer, an I-layer, and an N-layer is deposited onto the structure shown in FIG. 6 so that if the first monolithic structure consisting of the N-layer 214, the I-layer 215, and the P-layer 230 has a PIN structure with the N-layer deposited directly onto the common transparent substrate 204, the second continuous monolithic structure will have an NIP structure. As shown in FIG. 6, the second monolithic NIP structure, which consists of a P-layer 230, an I-layer 221, and an N-layer 223, is deposited over the entire surface of the first monolithic structure shown in FIG. 6 to subsequently form the second PV cells, such as the PV cell 202b2 of the individual TSC 202b shown in FIG. 1. In this operation, the P-layer 230 is deposited onto the exposed bottom surfaces 209 through 209n1 of the aforementioned extension 212 of the N-layer 214 (FIG. 4) and onto the first insulating layer 218, which remains after selectively etching the PIN structure in the process shown in FIG. 6; the I-layer 221 is deposited onto the P-layer 230; and the N-layer 223 is deposited onto the I-layer 221. Furthermore, a tunnel junction (TJ) 210 is formed between the bottom P-layer 230 of the second PV cell and the extension 212 of the N-layer 214 of the first PV cell that extends into the area of the second PV cell.

Figure 8:
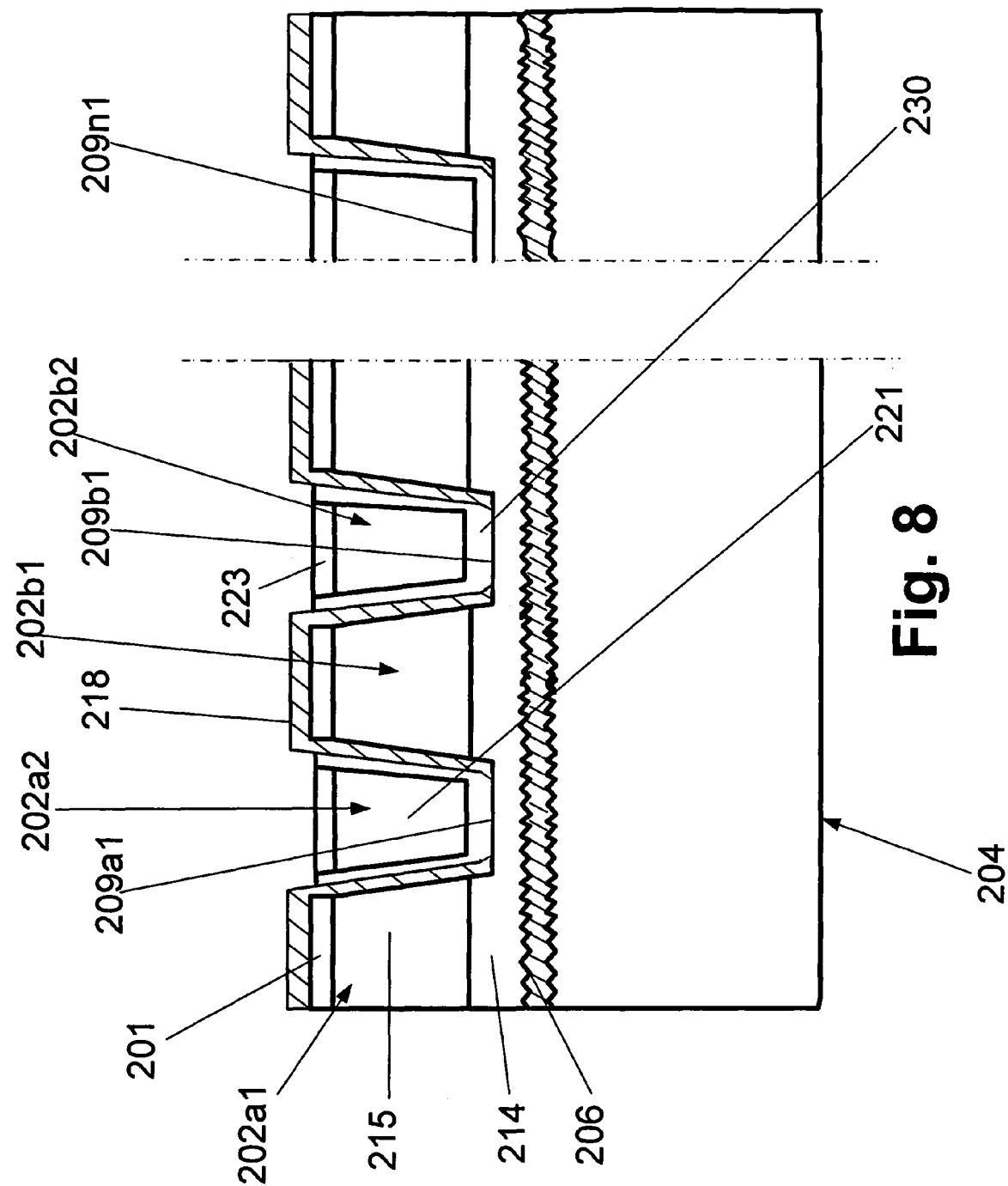

In the step of FIG. 7, a part of the second monolithic NIP structure fills the recesses between the first PV cells 202a1 through 202n1 so that after removal of the that are not coplanar with the first monolithic PIN structures shown in FIG. 4, the second PV cells, such as the second PV cell 202b2, are formed, and the structure shown in FIG. 8 is obtained. In order to preserve structural and electrical properties of the PIN structure of the first PV cells 202a1, 202b1, and so forth, and to ensure substantial coplanarity of the sublayers of the first and second PV cells, the RF-PECVD process is performed at the same or lower deposition temperature, and the bottom P-layer 230 is made thinner than the N-layer 214 of the first PV cell.

As can be seen in FIG. 8, the structure obtained after removal of those portions of the NIP structure shown in FIG. 7 that are not coplanar with the PIN structures shown in FIG. 4 comprises a plurality of the first PV cells 202a1, 202b1, etc., and the second PV cells 202a2, 202b2, etc., which are arranged in alternating order and are isolated from each other over their side walls by the first insulating layer 218. Furthermore, the PIN structures of the aforementioned first and second PV cells have inverse sequences of doped layers so that the PIN structure of the first PV cell of an individual TSC is arranged adjacent and coplanar to the NIP structure of the second PV cell, and vice versa. In other words, as shown in FIG. 8, the P-layer 201 of the first PV cell 202a1 is coplanar with the N-layer 223 of the second PV cell 202a2, the N-layer 214 of the first PV cell 202a1 is essentially coplanar with the P-layer 230 of the second PV cell 202a2, the P-layer 201 of the first PV cell 202b1 is coplanar with the N-layer 223 of the second PV cell 202b2, and so forth. Furthermore, for current-matching purposes between adjacent cells, all PV cells 202a1, 202a2, 202b1, 202b2, etc., have essentially the same thickness and lateral dimensions, which are defined later with references to FIGS. 15 and 16.

Figure 9:
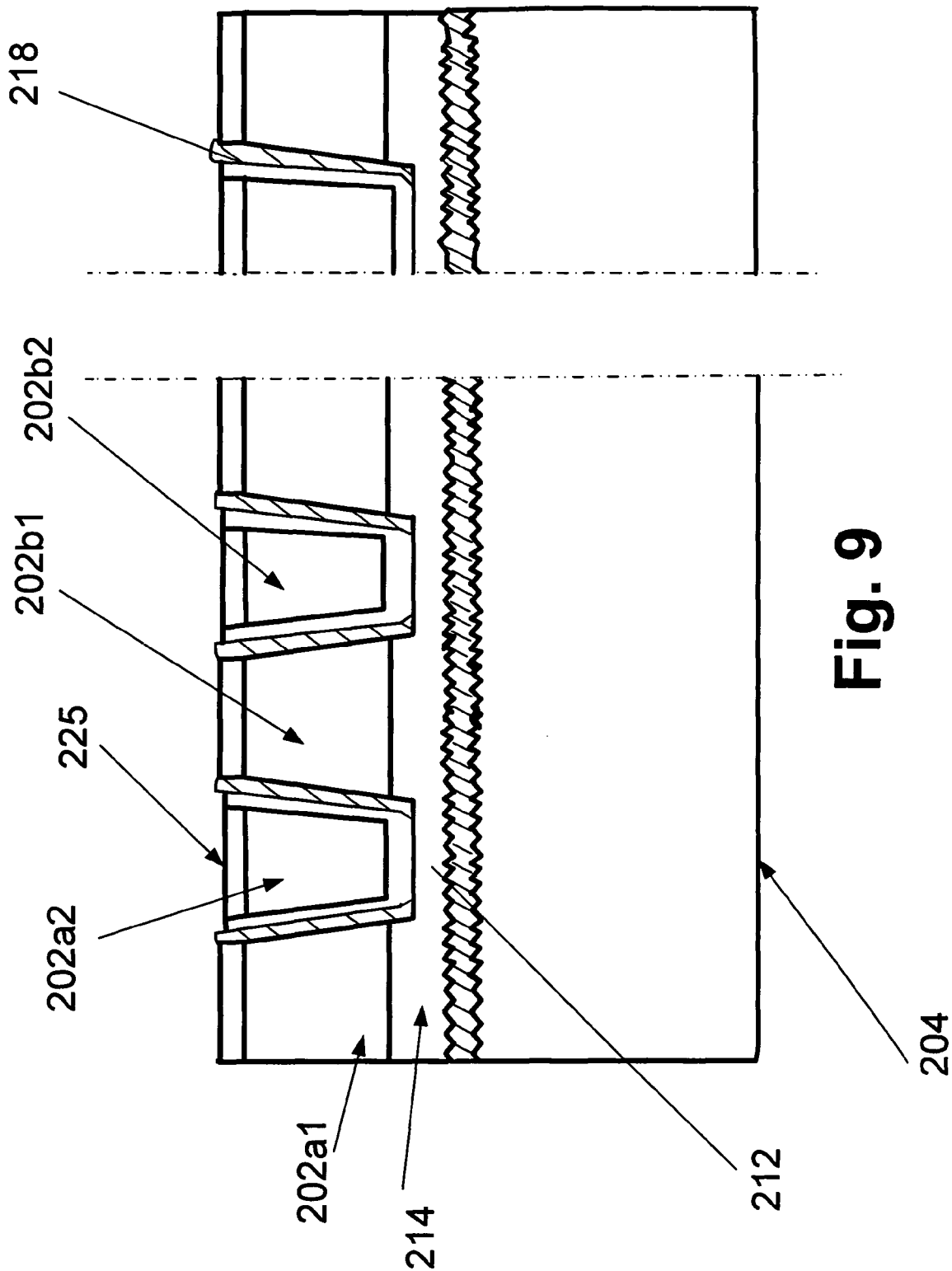

In the step shown in FIG. 9, the first insulation layer 218 is removed from the top of the structure, leaving the rest of the structure intact. As a result, a substantially even top surface 225 is obtained.

Figure 10:
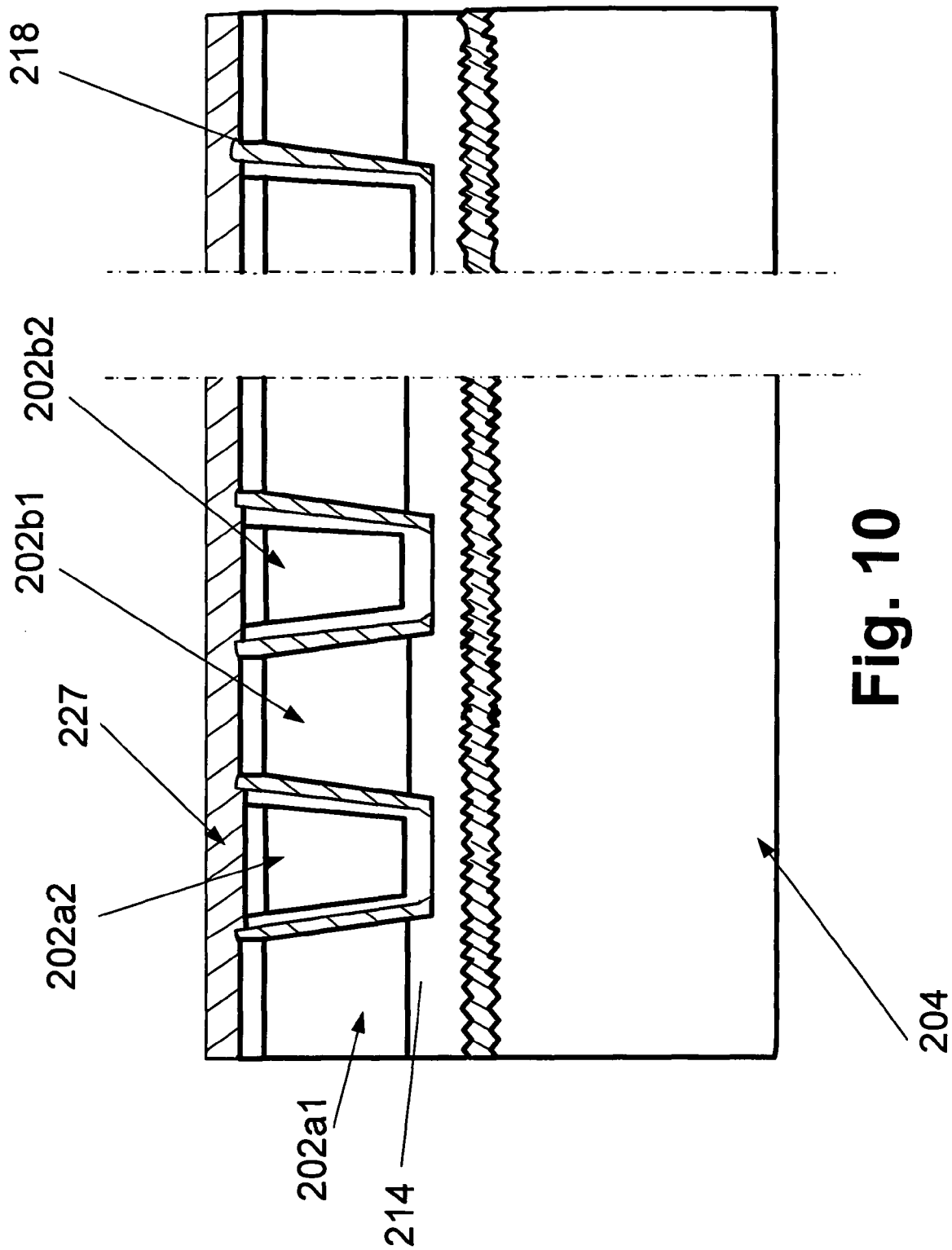

In FIG. 10, the entire even top surface 225 of the structure shown in FIG. 9 is coated with a second insulating layer 227, which is made of $SiO_2$, for example.

Figure 11:
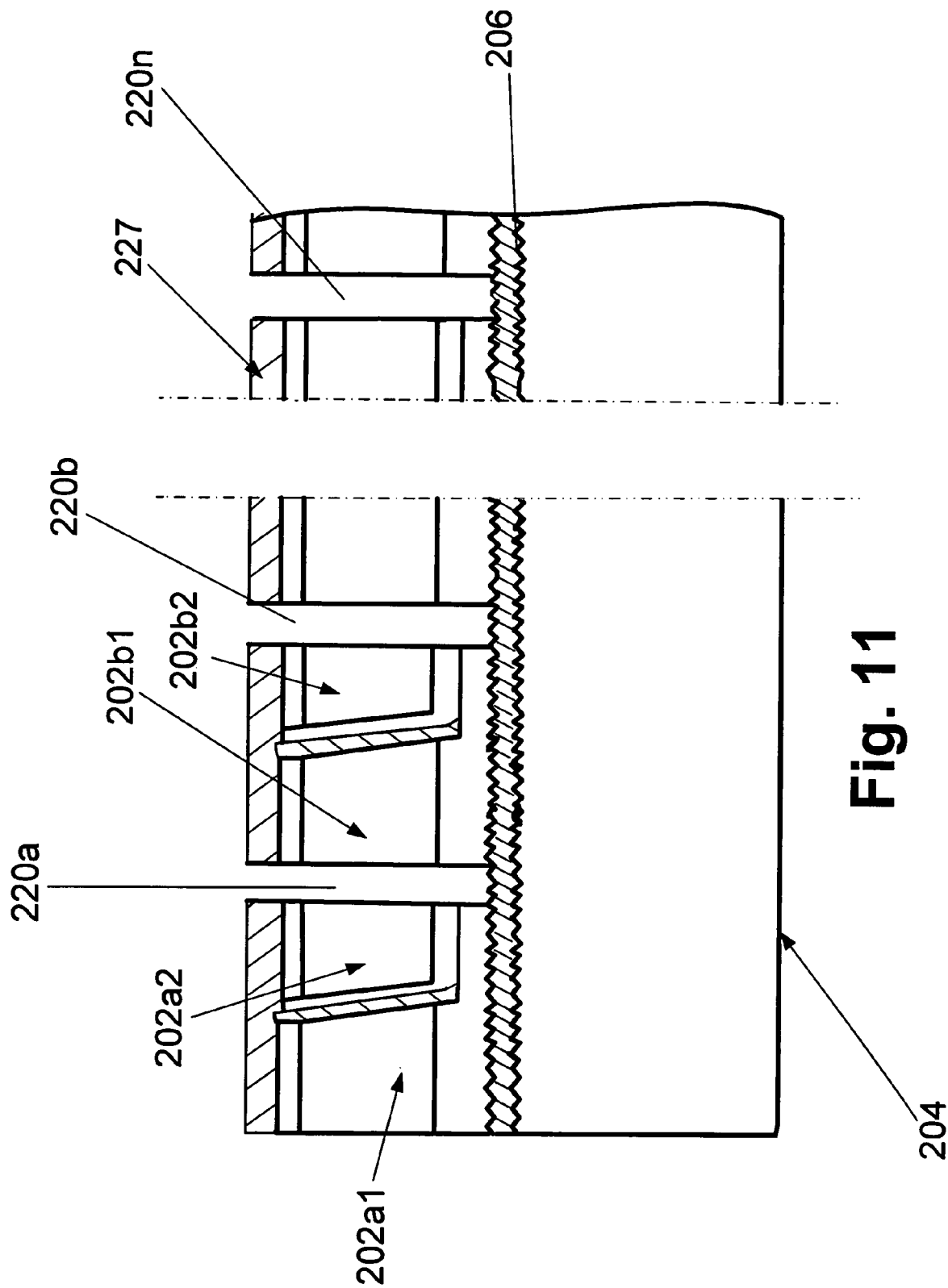

In the next step, which is shown in FIG. 11, deep trenches 220a through 220n are formed from the surface of the second insulating layer 227 extending to the common transparent substrate 204, more specifically, to the surface of the AR film 206. The deep trenches 220a through 220n define and isolate adjacent individual TSCs 202a through 202n, which are formed during this operation. Each TSC is formed by a pair of adjacent PV cells, i.e., by a first PV cell and a second PV cell. Thus, the TSC 202a is formed by the first PV cell 202a1 and the second PV cell 202a2; the TSC 202b is formed by the first PV cell 202b1 and the second PV cell 202b2, etc.

The deep trenches and insulation layers described above are made according to well known patterning processes, such as masking, reactive ion etching (RIE) or laser scribing, and chemical vapor deposition (CVD). RIE is an etching technology that uses chemically reactive plasma for removing material. The plasma is generated under low pressure (vacuum) by an electromagnetic field. High-energy ions from the plasma attack the treated surface and react with it. Depending on the specific structure, the width of the deep trenches acn vary in the range of 0.5 μm to 2 μm.

Figure 12:
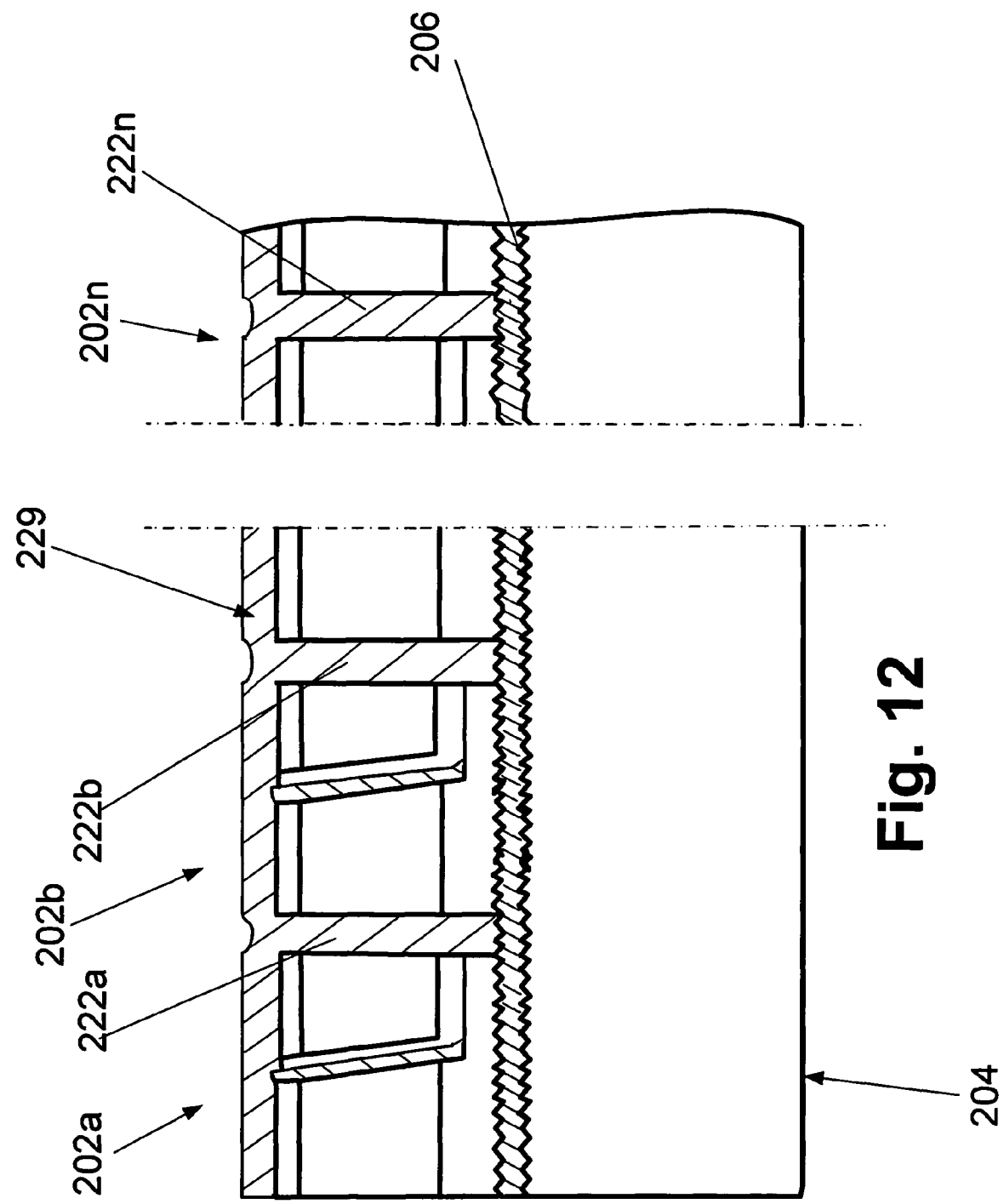

As shown in FIG. 12, the deep trenches 220a through 220n are filled with an insulating material such as $SiO_2$, which forms insulating layers 222a through 222n and which provide reliable electrical isolation of adjacent TSCs 202a through 202n, respectively. The filling operation can be carried out by high-pressure CVD, PECVD, or the like. This process simultaneously provides continuous coating of the backside surface and the third insulating layer 229.

Figure 13:
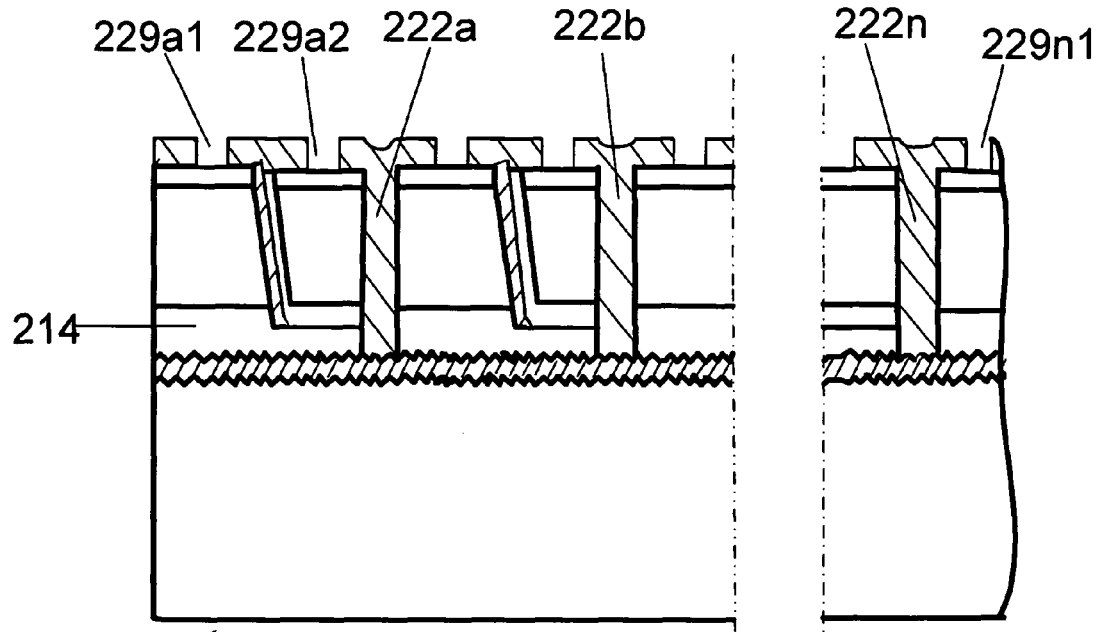

FIG. 13 is a view of the structure obtained after forming first windows 229a, 229b, and 229n for metal electrodes 224a1, 224a2, and so on through 224n2 of the first and second PV cells in all individual TSCs, respectively, which are shown in FIG. 1.

Figure 14:
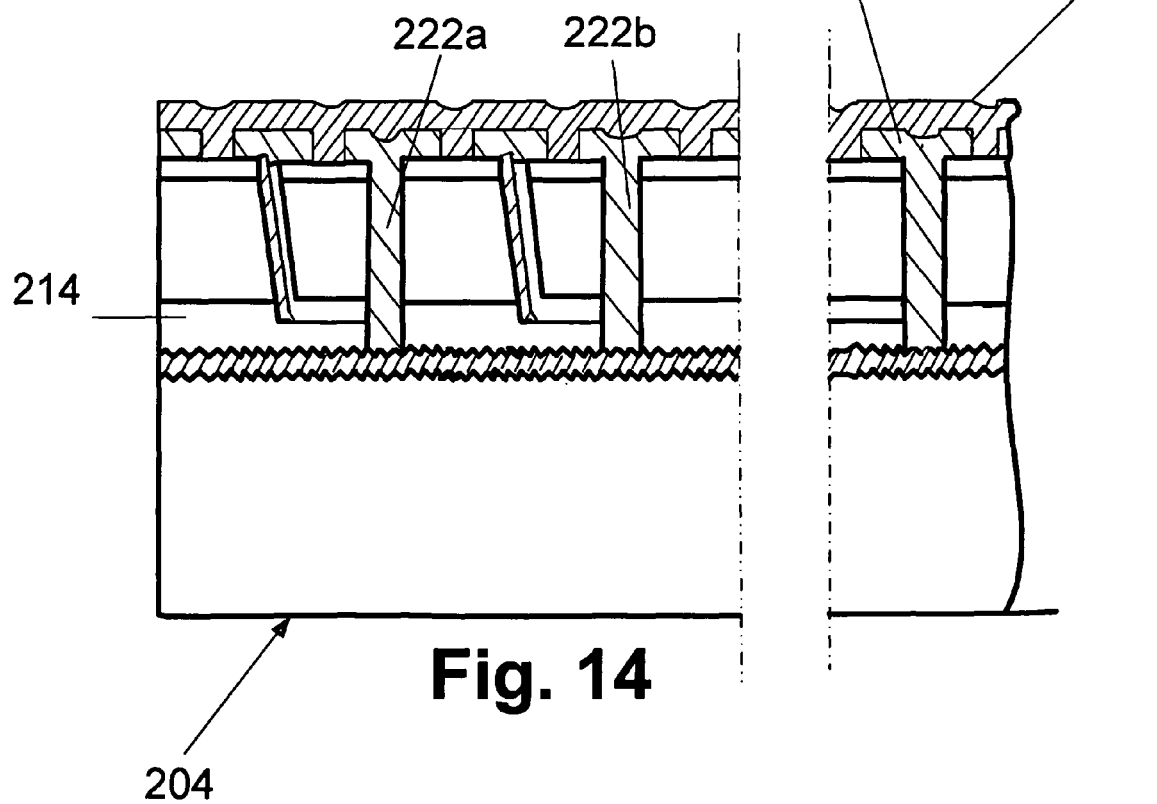

As shown in FIG. 14, the entire surface of the structure of FIG. 13 is coated with a first metal layer 231. This metal layer is deposited onto the top surface of the third insulating layer 229 (FIG. 12), which remains after formation of the first windows 229a1, 229a2 through 229n1. Metal of this layer also fills the space of each window formed in the previous step. Metal can be chosen from the group of metals such as Al, Ag, Ni or their alloys and deposited, e.g., by known sputtering techniques.

Figure 15:
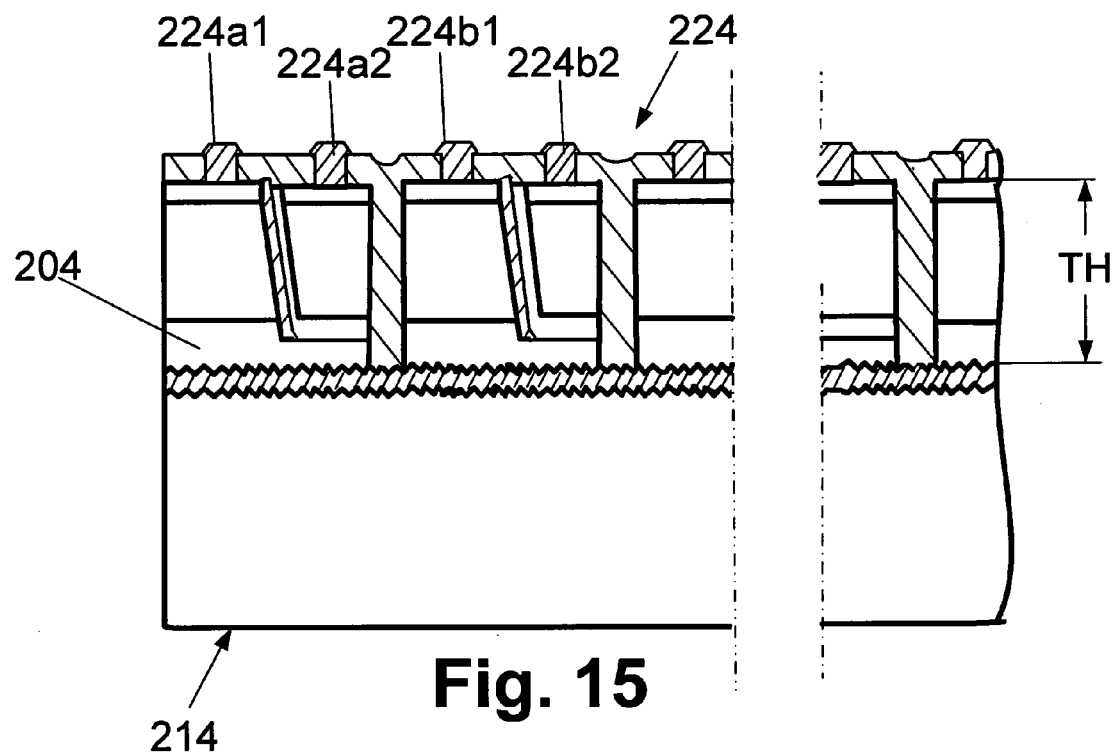

FIG. 15 is a view of the structure obtained after forming conductive electrodes of the first and second PV cells in all individual TSCs by selectively removing the first metal layer 231 and forming an electrode-exposed surface 224. In other words, electrodes 224a1 and 224a2 of the first TSC202a, electrodes 224b1 and 224b2 of the second TSC 202b, etc., are formed. Alternatively, metal electrodes 224a1, 224a2, etc., can be formed by direct inkjet printing of desired electrodes onto the first windows 229a1, 229a2, etc. In this case the step of depositing the first metal layer 221 shown in FIG. 14 can be omitted.

Figure 16:
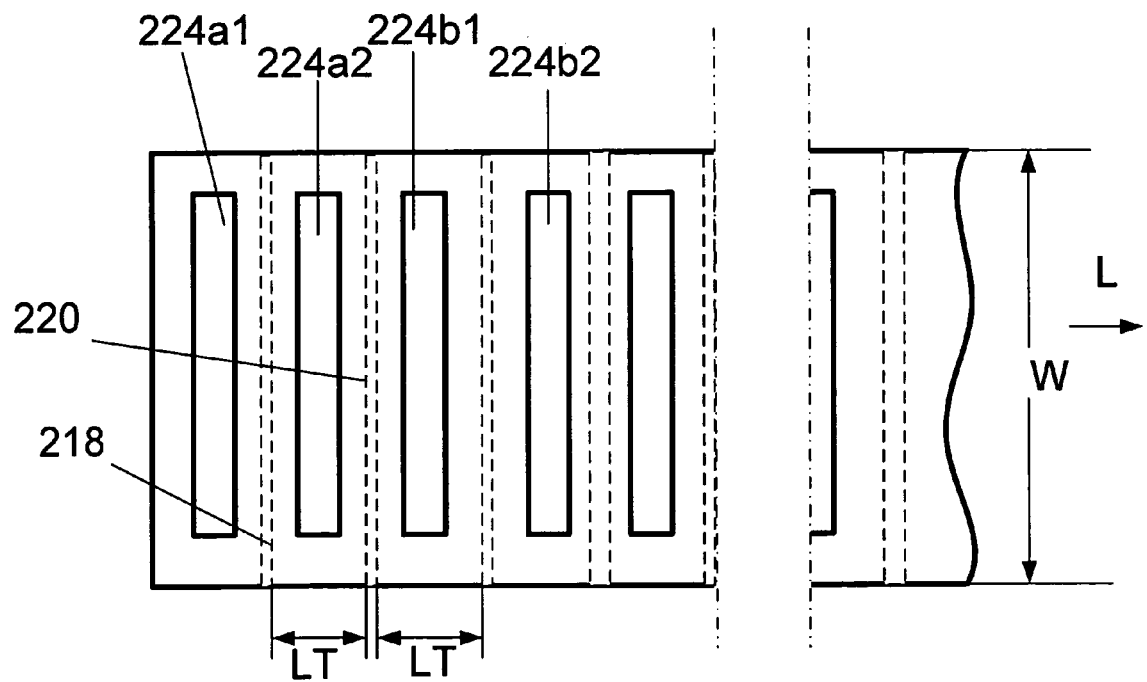

FIG. 16 is a top view of the structure shown in FIG. 15. It can be seen that the electrodes 224a1, 224a2, 224b1, 224b2, and so forth, are arranged in the lateral direction of the structure. The insulation layers 218 (FIGS. 1, 8, and 16) and 222a and 222b (FIGS. 12 to 15) are shown in FIG. 16 by broken lines and extend across the structure from side to side in the direction perpendicular to direction L. It can be seen from FIGS. 15 and 16 that first and second PV-cells have essentially the same width W, lateral dimension LT, and thickness TH (which, in fact, is essentially the thickness of the I-layer of both PV-cells, i.e., the dimension in the direction perpendicular to the common transparent substrate).

Figure 17:
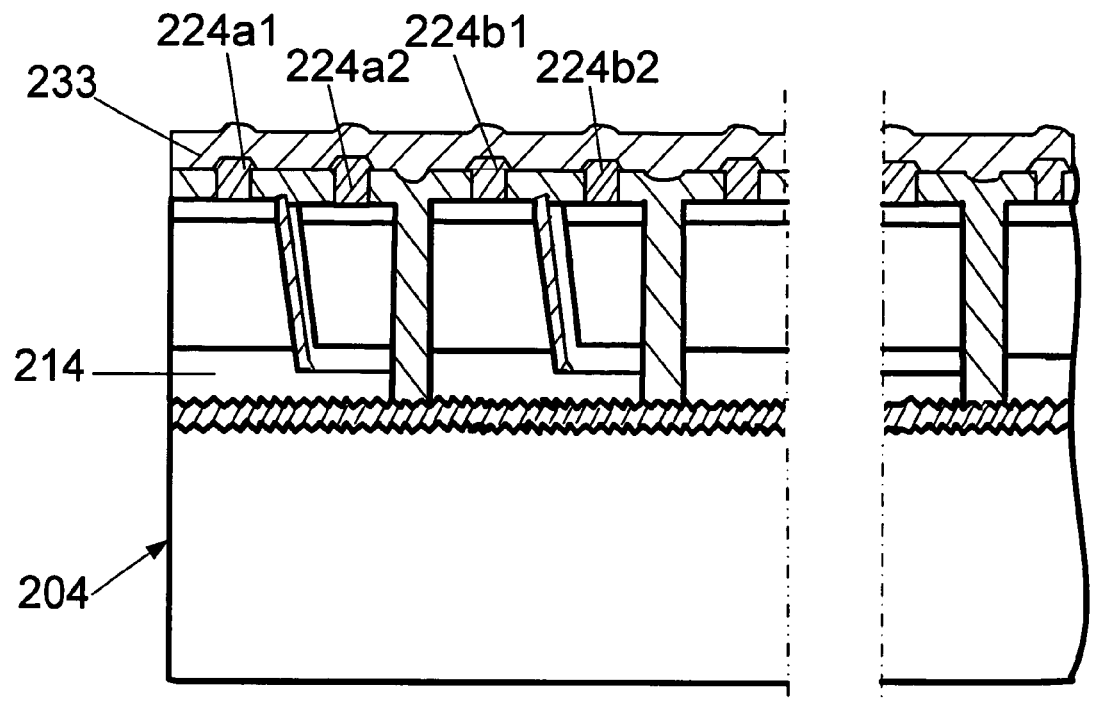

In the step shown in FIG. 17, the entire top surface of the structure shown in FIG. 16 is coated with a fourth insulating layer 233.

Figure 18:
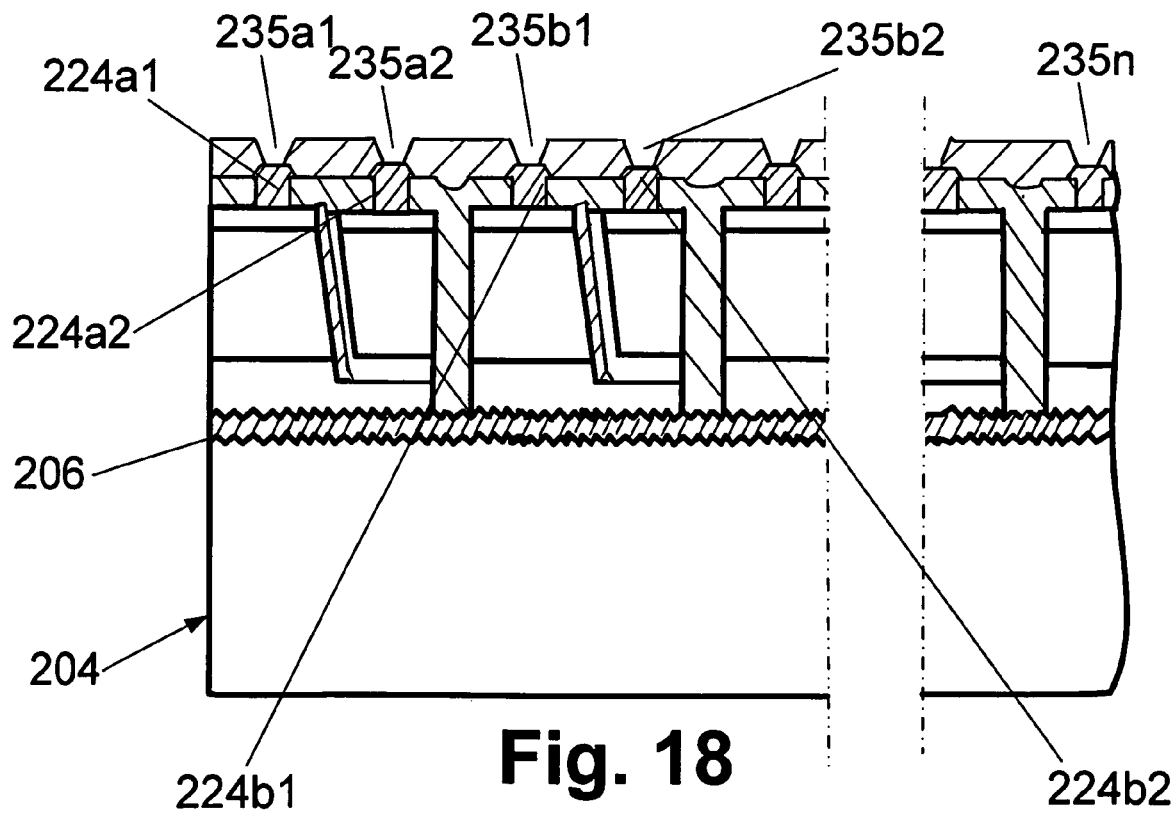
Figure 19:
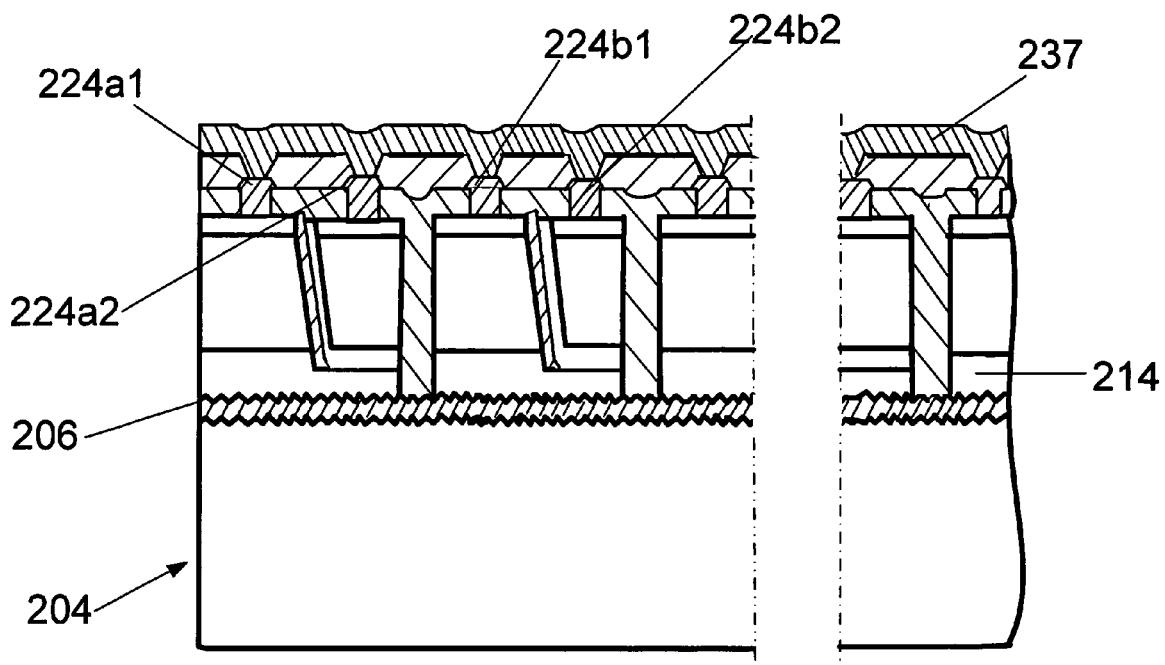

In the next step shown in FIG. 18, the second windows 235a1, 235a2, and 235b1 through 235n1 that expose the top surfaces of the electrodes, such as 224a1, 224a2, and 224b1, respectively, are formed in the fourth insulating layer 233 (FIG. 17). These second windows are intended for subsequent formation of conducting links in the step shown in FIG. 19. More specifically, a second metal layer 237 is deposited onto the entire top surface of the structure shown in FIG. 18. Material of the second metal layer 237 covers the top areas of the fourth insulating layer 233 and fills the second windows 235a1, 235a2, and 235b1 through 235n1.

Figure 20:
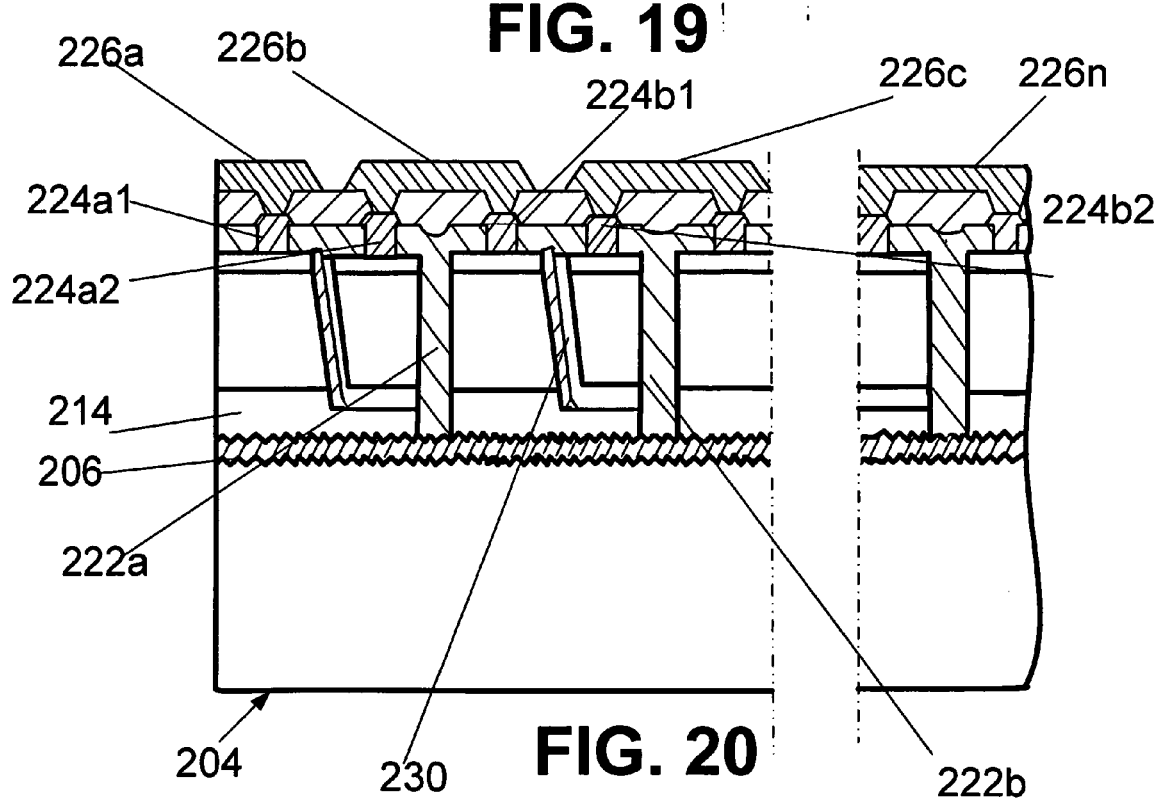

In the next step shown in FIG. 20, the metal layer 237 is selectively removed so that only portions of the metal layer that form conducting links 226a, 226b, and 226c through 226n remain. Alternatively, the conductive links 226a, 226b, and 226c through 226n can be formed by direct inkjet printing onto the second windows and areas between the windows. In this case, selective removal of the second metal layer 237 described above can be omitted. As a result, the adjacent TSCs are electrically connected in series.

Finally, an integrated monolithic thin-film solar cell 200 (of the type shown in FIG. 1) with enhanced output voltage and automatic current matching between component cells is produced. An image of the structure shown in FIG. 20 slightly differs from the image shown in FIG. 1. For example, FIG. 20 is shown with P-layers 230 deposited onto the insulation layers 218 on the sides of the first PV cells 202a1, 202b1, etc. In fact, such P-layers 230 are present on the insulation layers of the structure shown in FIG. 1 as well, but they are not shown. Furthermore, some identical elements of the integrated monolithic thin-film solar cell 200 shown in FIG. 1 have designations different from those that show intermediate steps of the process. This occurs because the layers that are continuous in some manufacturing steps are divided into a plurality of layer portions that in the final product (FIG. 1) belong to different elements of the integrated monolithic thin-film solar cell 200.

Thus, it has been shown that the invention provides a method of manufacturing an integrated monolithic thin-film solar cell that has enhanced output voltage and automatic current matching between component cells. The enhanced output voltage of the device of the invention can be as high as 100 V or higher and can be achieved by manufacturing a single monolithic device in a single microelectronic process without connecting in series a plurality of premanufactured solar cells.

Although the invention is described with reference to specific embodiments, these embodiments should not be construed as limiting the areas of application of the invention and any changes and modifications are possible provided that these changes and modifications do not depart from the scope of the attached patent claims. For example, the sequence of steps can be slightly modified to reduce cycle time or to provide better control of layer properties. Also, rather than applying layer 227, laser scribing can be used to cut deep trenches directly after the step shown in FIG. 9, and then the trenches can be filled with insulating material in order to form the second insulating layers. Thus, two steps can be used instead of three.

The invention claimed is:

1. A method of manufacturing a monolithic thin-film photovoltaic device with enhanced output voltage comprising:
providing a common transparent substrate having a longitudinal direction and a light-receiving surface,
forming on said common transparent substrate a plurality of adjacent individual TSCs, which are arranged in the longitudinal direction of the common transparent substrate, each individual TSC of said plurality comprising a first PV cell and a second PV cell, said first PV cell comprising a P-doped layer, an I-layer, and an N-doped layer, said second PV cell comprising a P-doped layer, an I-layer, and an N-doped layer;
said first PV cells and second PV cells each having a thickness and a lateral dimension;
arranging the P-doped layer of the first PV cell substantially coplanar with the N-doped layer of the second PV-cell; arranging the I-layer of the first PV cell substantially coplanar with the I-layer of the second PV-cell; and arranging the N-doped layer of the first PV cell substantially coplanar with the P-doped layer of the second PV-cell;
forming a tunnel junction between the N-doped layer of one PV cell of an individual TSC and the P-doped layer of another PV cell of the same TSC by providing an overlapped portion between said N-doped layer of said one PV cell and said P-doped layer of said another PV cell, thus electrically connecting said one PV cell with said another PV cell;
providing electrical connection between the second PV-cell of each individual TSC of said plurality with the first PV cell of the adjacent individual TSC, thus electrically connecting in series all individual TSCs of said plurality and enhancing output voltage of the monolithic thin-film photovoltaic device.

2. The method of claim 1, further comprising the step of electrically isolating the first PV cell of each individual TSC from the second PV cell of the same individual TSC by means of an insulating layer placed over the entire area of their juxtaposition except for the tunnel junction, and electrically isolating each individual TSC from an adjacent individual TSC.

3. The method of claim 2, wherein the step of forming said plurality of adjacent individual TSCs, each consisting of a first PV cell and a second PV cell, comprises:
 forming a first monolithic structure composed of a P-doped layer, an I-layer, and an N-doped layer arranged in a structure selected from the PIN structure or NIP structure wherein the sequence of layers in the PIN and NIP structures is defined in the direction toward the common transparent substance;
 forming alternating projections and recesses in the first monolithic structure by removing a part of the first monolithic structure;
 coating the surfaces of the projections and recesses with a second monolithic structure composed of an N-doped layer, an I-layer, and a P-doped layer and thus filling the recesses, the sequence of the N-doped layer, I-layer, and P-doped layer being inversed with respect to the sequence of the N-doped layer, I-layer, and P-doped layer of the first monolithic structure.

4. The method of claim 3, wherein the step of electrically connecting in series all individual TSCs of said plurality of individual TSCs comprises forming electrodes on the first PV cells and the second PV cells and forming conducting links that electrically connect the electrodes of the second PV cells of individual TSCs with the electrodes of the first PV cells of the adjacent TSCs.

5. The method of claim 4, wherein the electrodes are made by coating the first PV cells and the second PV cells on the side opposite the common transparent substrate with an insulating layer, selectively removing the insulating layer in the area where the electrodes are to be made and thus making first windows, coating the first PV-cells and the second PV-cells with a first metal layer and filling the first windows with a first metal, and then selectively removing the first metal from areas other than the electrodes, thus forming an electrode-exposed surface.

6. The method of claim 5, wherein the conducting links are made by coating the electrode-exposed surface with an insulating material, selectively removing the insulating material above the electrodes and thus making second windows, coating the electrode-exposed surface with a second metal layer and filling the second windows with a second metal, and then selectively removing the second metal from areas other than the conducting links.

7. The method of claim 2, wherein the step of electrically isolating each individual TSC from an adjacent individual TSC comprises forming a trench between adjacent individual TSCs, the trench extending to the common transparent substrate, and filling the trench with an insulating material.

8. The method of claim 1, wherein the step of forming said plurality of adjacent individual TSCs, each consisting of a first PV cell and a second PV cell, comprises:
 forming a first monolithic structure composed of a P-doped layer, an I-layer, and an N-doped layer arranged in a structure selected from the PIN structure or NIP structure wherein the sequence of layers in the PIN and NIP structures is defined in the direction toward the common transparent substance;
 forming alternating projections and recesses in the first monolithic structure by removing a part of the first monolithic structure;
 coating the surfaces of the projections and recesses with a second monolithic structure composed of an N-doped layer, an I-layer, and a P-doped layer thus filling the recesses, the sequence of the N-doped layer, I-layer, and P-doped layer being inversed with respect to the sequence of the N-doped layer, I-layer, and P-doped layer of the first monolithic structure.

9. The method of claim 8, wherein the step of electrically connecting in series all individual TSCs of said plurality of individual TSCs comprises forming electrodes on the first PV cells and the second PV cells and forming conducting links that electrically connect the electrodes of the second PV cells of individual TSCs with the electrodes of the first PV cells of the adjacent TSCs.

10. The method of claim 9, wherein the electrodes are made by coating the first PV-cells and the second PV-cells on the side opposite the common transparent substrate with an insulating layer, selectively removing the insulating layer in the area where the electrodes are to be made thus making first windows, coating the first PV-cells and the second PV-cells with a first metal layer and filling the first windows with a first metal, and then selectively removing the first metal from areas other than the electrodes, thus forming an electrode-exposed surface.

11. The method of claim 10, wherein the conducting links are made by coating the electrode-exposed surface with an insulating material, selectively removing the insulating material above the electrodes and thus making second windows, coating the electrode-exposed surface with a second metal layer and filling the second windows with a second metal, and then selectively removing the second metal from areas other than the conducting links.

12. The method of claim 1, wherein the step of forming said plurality of adjacent individual TSCs, each consisting of a first PV cell and a second PV cell, comprises:
 forming a first monolithic structure composed of a P-doped layer, an I-layer, and an N-doped layer arranged in a structure selected from the PIN structure or NIP structure wherein the sequence of layers in the PIN and NIP structures is defined in the direction toward the common transparent substance;
 forming alternating projections and recesses in the first monolithic structure by removing a part of the first monolithic structure; and
 coating the surfaces of the projections and recesses with a second monolithic structure composed of an N-doped layer, an I-layer, and a P-doped layer and thus filling the recesses, the sequence of the N-doped layer, I-layer, and P-doped layer being inversed with respect to the sequence of the N-doped layer, I-layer, and P-doped layer of the first monolithic structure.

13. The method of claim 12, wherein the step of electrically connecting in series all individual TSCs of said plurality of individual TSCs comprises forming electrodes on the first PV cells and the second PV cells and forming conducting links that electrically connect the electrodes of the second PV cells of individual TSCs with the electrodes of the first PV cells of the adjacent TSCs.

14. The method of claim 13, wherein the electrodes are made by coating the first PV cells and the second PV cells on the side opposite the common transparent substrate with an insulating layer, selectively removing the insulating layer in the area where the electrodes are to be made and thus making first windows, coating the first PV-cells and the second PV-cells with a first metal layer and filling the first windows with a first metal, and then selectively removing the first metal from areas other than the electrodes, thus forming an electrode-exposed surface.

15. The method of claim 14, wherein the conducting links are made by coating the electrode-exposed surface with an insulating material, selectively removing the insulating material above the electrodes and thus making second windows, coating the electrode-exposed surface with a second metal layer and filling the second windows with a second metal, and then selectively removing the second metal from areas other than the conducting links.

16. The method of claim 1, further comprising the step of making the first PV cells with the thickness, width, and lateral dimension substantially equal to the thickness, width, and lateral dimension of the second PV cells, thus providing automatic current matching between the first PV cell and the second PV cell as well as between the individual TSCs.

17. The method of claim 16, further comprising:
electrically isolating the first PV cell of each individual TSC from the second PV cell of the same individual TSC by means of an insulating layer placed over the entire area of their juxtaposition except for the tunnel junction; and
forming a trench between adjacent individual TSCs, the trench extending to the common transparent substrate, and filling the trench with an insulating material, thus electrically isolating the adjacent individual TSCs.

18. A method of manufacturing a monolithic thin-film photovoltaic device with enhanced output voltage comprising the following steps:
providing a common transparent substrate having a longitudinal direction and a light-receiving surface;
depositing onto a common transparent substrate a first continuous structure consisting of a P-doped layer, an I-layer, and an N-doped layer, the sequence of the layers in the direction toward the common transparent substrate being selected from the group consisting of a PIN structure and NIP structure;
forming alternating projections and recesses in the first continuous structure, leaving between the bottom of each recess and the common transparent substrate a part of the doped layer nearest the common transparent substrate, the bottom of each recess being located in the N-doped layer if the continuous structure is a PIN structure or in the P-doped layer if the continuous structure is a NIP structure;
coating the surfaces of the projections and the bottoms of the recesses with a first insulating layer;
selectively removing the first insulating layer only from the bottoms of the recesses;
coating the surfaces of the projections, which are coated with the first insulating layer, and filling the recesses down to the bottoms thereof with a second continuous structure that consists of an N-doped layer, an I-layer, and a P-doped layer, said second continuous structure being a NIP structure if the first continuous layer has a PIN structure or being a PIN structure if the first continuous layer has a NIP structure, whereby a tunnel junction being formed between the N-doped layer and the P-doped layer of the first continuous structure and the second continuous structure due to provision of said part of the doped layer nearest to the common transparent substrate; said second continuous structure being formed with coplanarity of I-layers of the first continuous structure with the I-layers of the second continuous structure, and with coplanarity between the N-doped layers and P-doped layers which are nearest the common transparent substrate and with the presence of partially noncoplanar portions between the second continuous structure on the side of the second continuous structure opposite the common transparent substrate;
removing the partially noncoplanar portions from the second continuous structure;
removing the first insulating layer from the top of the projections, thus forming a monolithic structure having a substantially even backside and comprising first PV cells formed by the projections and the second PV cells formed by the second continuous structure that fills the recesses, the first PV cells and the second PV cells each comprising a P-doped layer, an I-layer, and an N-doped layer with inverse sequence of the P-doped layer, an I-layer, and an N-doped layer in the adjacent first PV-cells and second PV-cells; each first PV cell and adjacent second PV cell forming an individual TSC, a plurality of TSCs being formed in the longitudinal direction of the common transparent substrate;
coating the even backside of the monolithic structure with a second insulating layer;
forming trenches in the monolithic structure between adjacent TSCs, the trenches extending from the backside of the monolithic structure to the common transparent substrate;
coating the backside of the monolithic structure and filling the trenches with a third insulating material;
forming first windows by selectively etching the insulating material on the backside of the monolithic structure;
coating the entire backside of the monolithic structure with a first metal layer and filling the first windows with the metal of the first metal layer;
forming metal electrodes of the first PV cells and of the second PV cells by selectively removing portions of the first metal layer and leaving metal where electrodes are to be formed;
coating the backside of the monolithic structure, including the metal electrodes, with a fourth insulating layer;
forming second windows in the fourth insulating layer above the electrodes;
coating the backside of the monolithic structure with the second metal layer and filling the second windows with the metal of the second metal layer; and
selectively removing portions of the second metal layer and forming conducting links that electrically connect electrodes of the second PV cells of each individual TSC with the first electrode of the adjacent individual TSC, thus completing manufacture of the monolithic thin-film photovoltaic device.

19. The method of claim 18, providing current matching of the first PV cells with the second PV cells by making the thickness, lateral dimension, and width of the first PV cells substantially equal to the thickness, lateral dimension, and width of the second PV cell.

20. The method of claim 18, wherein the trenches and insulating layers are made by a process selected from the group consisting of masking, reactive ion etching, laser scribing, and chemical vapor deposition.

* * * * *